(12) United States Patent
Park et al.

(10) Patent No.: US 10,867,388 B2
(45) Date of Patent: Dec. 15, 2020

(54) SYSTEM AND METHOD FOR MULTI-CONTRAST MAGNETIC RESONANCE IMAGING

(71) Applicants: SHANGHAI UNITED IMAGING HEALTHCARE CO., LTD., Shanghai (CN); SUNGKYUNKWAN University, Seoul (KR)

(72) Inventors: Jaeseok Park, Seoul (KR); Hyunkyung Maeng, Seoul (KR); Eunji Lim, Seoul (KR); Guobin Li, Shanghai (CN); Chaohong Wang, Shanghai (CN)

(73) Assignees: SHANGHAI UNITED IMAGING HEALTHCARE CO., LTD., Shanghai (CN); SUNGKYUNKWAN UNIVERSITY, Seoul (KR)

( * ) Notice: Subject to any disclaimer, the term of this patent is extended or adjusted under 35 U.S.C. 154(b) by 182 days.

(21) Appl. No.: 16/022,906

(22) Filed: Jun. 29, 2018

(65) Prior Publication Data
US 2019/0355125 A1 Nov. 21, 2019

Related U.S. Application Data

(63) Continuation of application No. PCT/CN2018/087731, filed on May 21, 2018.

(51) Int. Cl.
*G06T 7/174* (2017.01)
*G06T 7/00* (2017.01)

(52) U.S. Cl.
CPC ............ *G06T 7/174* (2017.01); *G06T 7/0012* (2013.01); *G06T 2207/10088* (2013.01); *G06T 2207/20056* (2013.01)

(58) Field of Classification Search
None
See application file for complete search history.

(56) References Cited

U.S. PATENT DOCUMENTS 7,817,838 B2 * 10/2010 DiBella ............... G01R 33/561
382/131
9,250,307 B2 * 2/2016 Huwer ............. G01R 33/56341
(Continued)

FOREIGN PATENT DOCUMENTS

CN 106772167 A 5/2017

OTHER PUBLICATIONS

International Search Report in PCT/CN2018/087731 dated Feb. 28, 2019, 5 pages.
(Continued)

*Primary Examiner* — Michelle M Entezari
(74) *Attorney, Agent, or Firm* — Metis IP LLC

(57) ABSTRACT

A method for image reconstruction may include: obtaining a plurality of sets of scan data captured by a magnetic resonance imaging (MRI) device, each set of scan data corresponding to a same scanning area of an object and corresponding to a plurality of scanning characteristics; generating one or more shareable data sets based on the plurality of sets of scan data; generating, based on the one or more shareable data sets, at least one optimized data set for each of the plurality of scanning characteristics; and reconstructing, based on at least one optimized data set for at least one of the plurality of scanning characteristics, the plurality of sets of scan data to obtain a reconstructed image for the at least one scanning characteristic.

17 Claims, 11 Drawing Sheets

(56) References Cited

U.S. PATENT DOCUMENTS

| | | | | |
|---|---|---|---|---|
| 9,619,904 | B2* | 4/2017 | Weizman | G01R 33/4835 |
| 10,089,722 | B2* | 10/2018 | Dannels | G06T 5/001 |
| 2009/0148062 | A1* | 6/2009 | Gabso | G06T 5/002 |
| | | | | 382/266 |
| 2009/0289631 | A1 | 11/2009 | Van Den Brink et al. | |
| 2013/0188854 | A1* | 7/2013 | Bilgic | A61B 5/055 |
| | | | | 382/131 |
| 2014/0085318 | A1* | 3/2014 | Nadar | G01R 33/5608 |
| | | | | 345/502 |
| 2014/0239949 | A1 | 8/2014 | Huang et al. | |
| 2014/0266192 | A1* | 9/2014 | Taviani | G01R 33/4828 |
| | | | | 324/309 |
| 2014/0285195 | A1* | 9/2014 | Stemmer | G01R 33/4818 |
| | | | | 324/309 |
| 2015/0168522 | A1* | 6/2015 | Gulaka | G01R 33/561 |
| | | | | 324/309 |
| 2015/0212176 | A1* | 7/2015 | Lee | G01R 33/5619 |
| | | | | 324/309 |
| 2016/0071264 | A1* | 3/2016 | Agam | G06K 9/3241 |
| | | | | 382/128 |
| 2018/0306884 | A1* | 10/2018 | Trzasko | G01R 33/5619 |
| 2019/0033409 | A1 | 1/2019 | Huang | |

OTHER PUBLICATIONS

Written Opinion in PCT/CN2018/087731 dated Feb. 28, 2019, 4 pages.

* cited by examiner

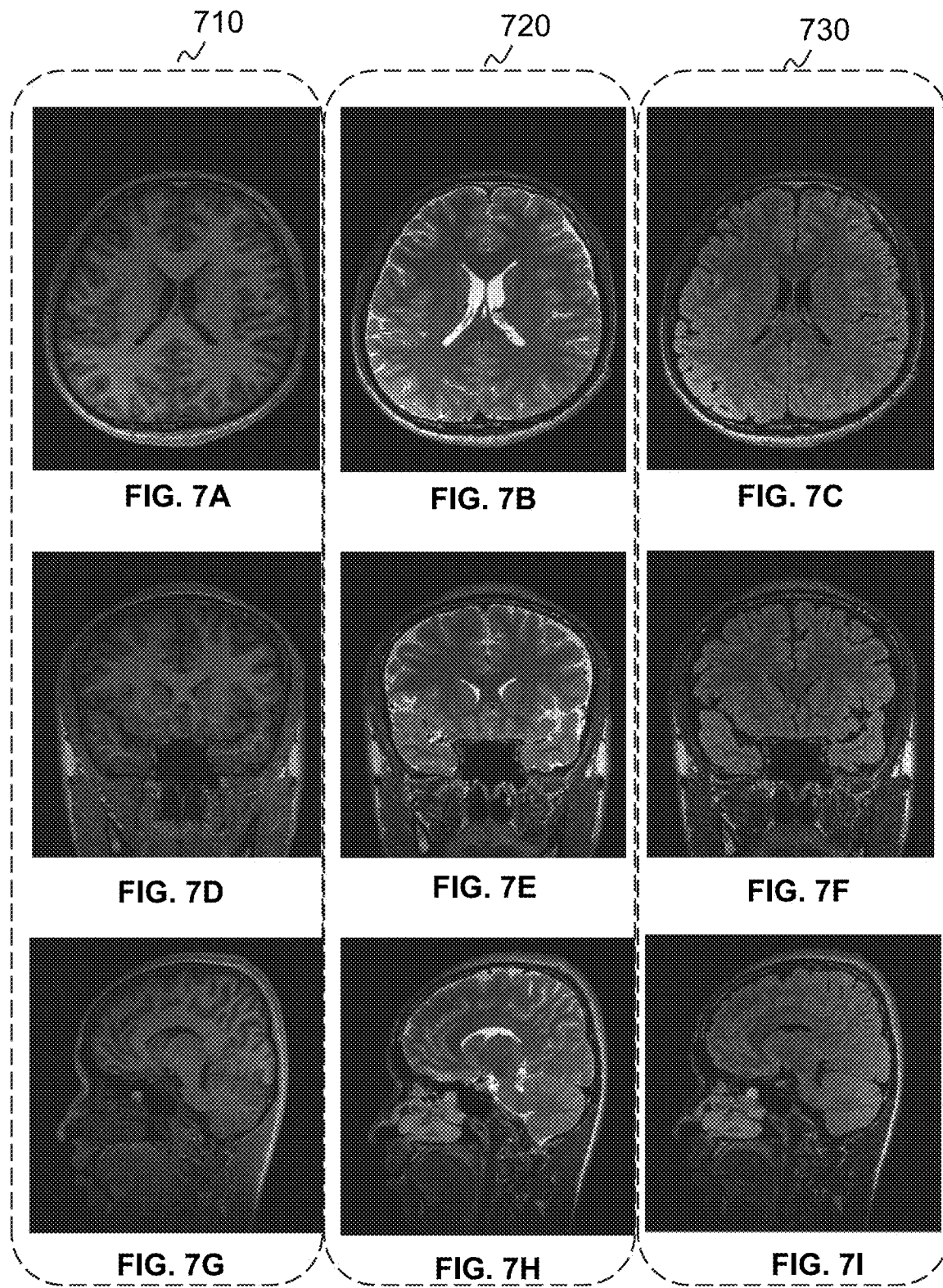

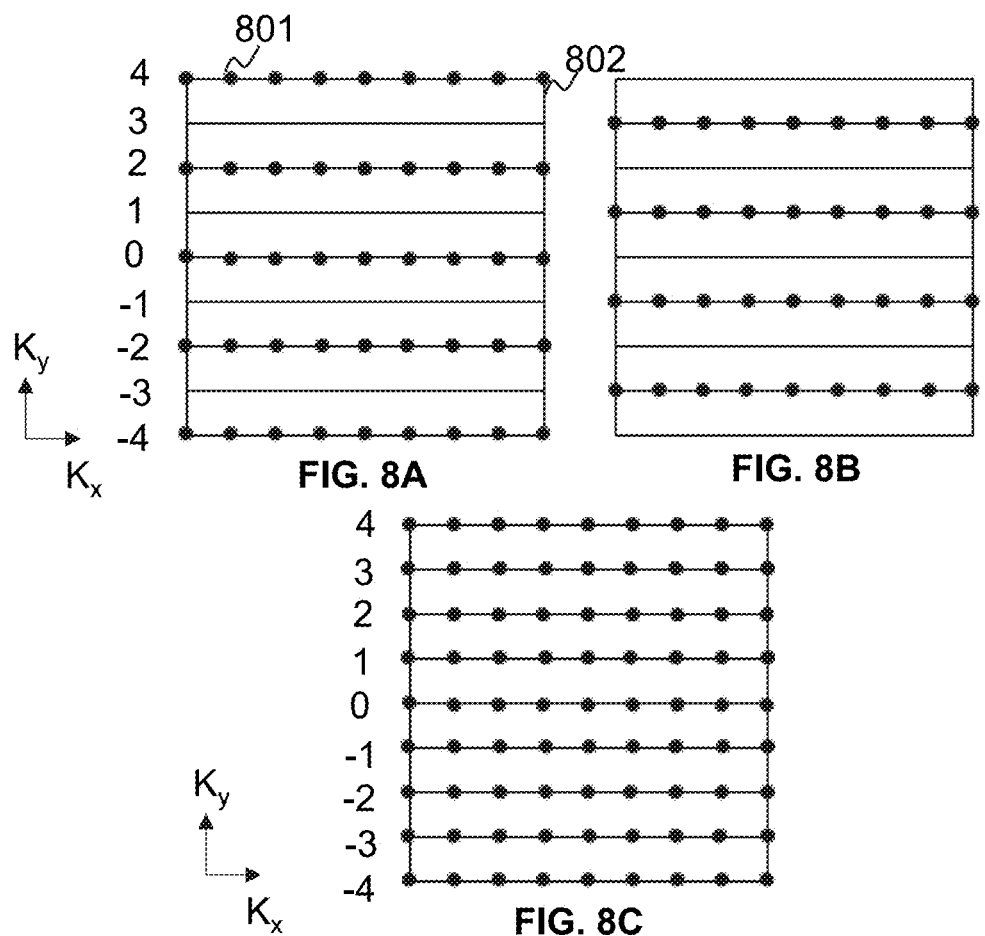

 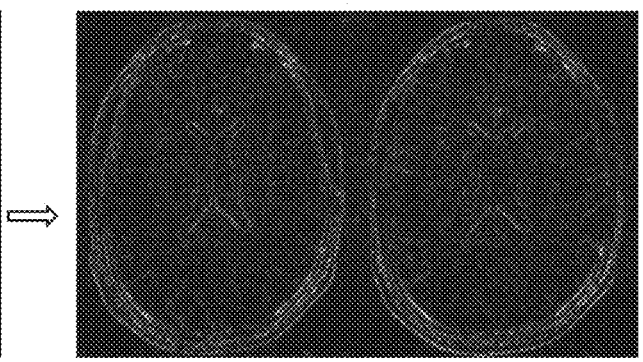
FIG. 10A   FIG. 10B          FIG. 10C   FIG. 10D
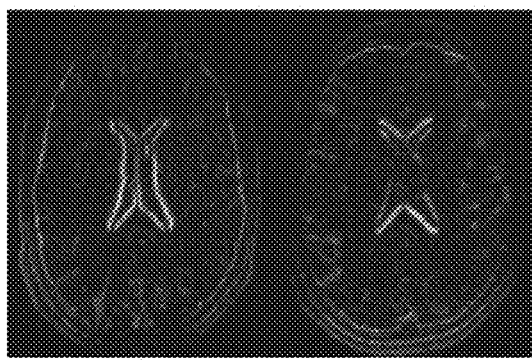 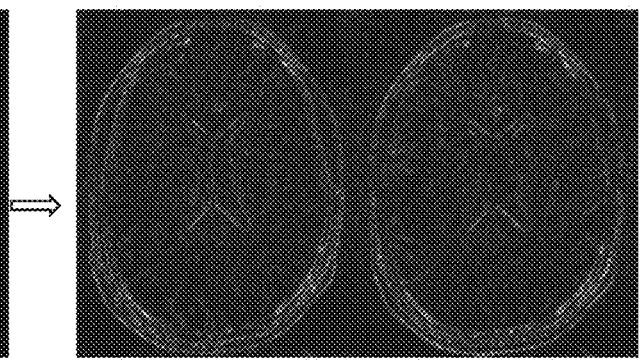
FIG. 10E   FIG. 10F          FIG. 10G   FIG. 10H
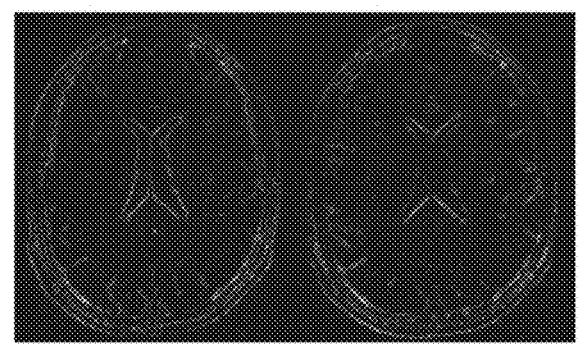
FIG. 10J   FIG. 10K

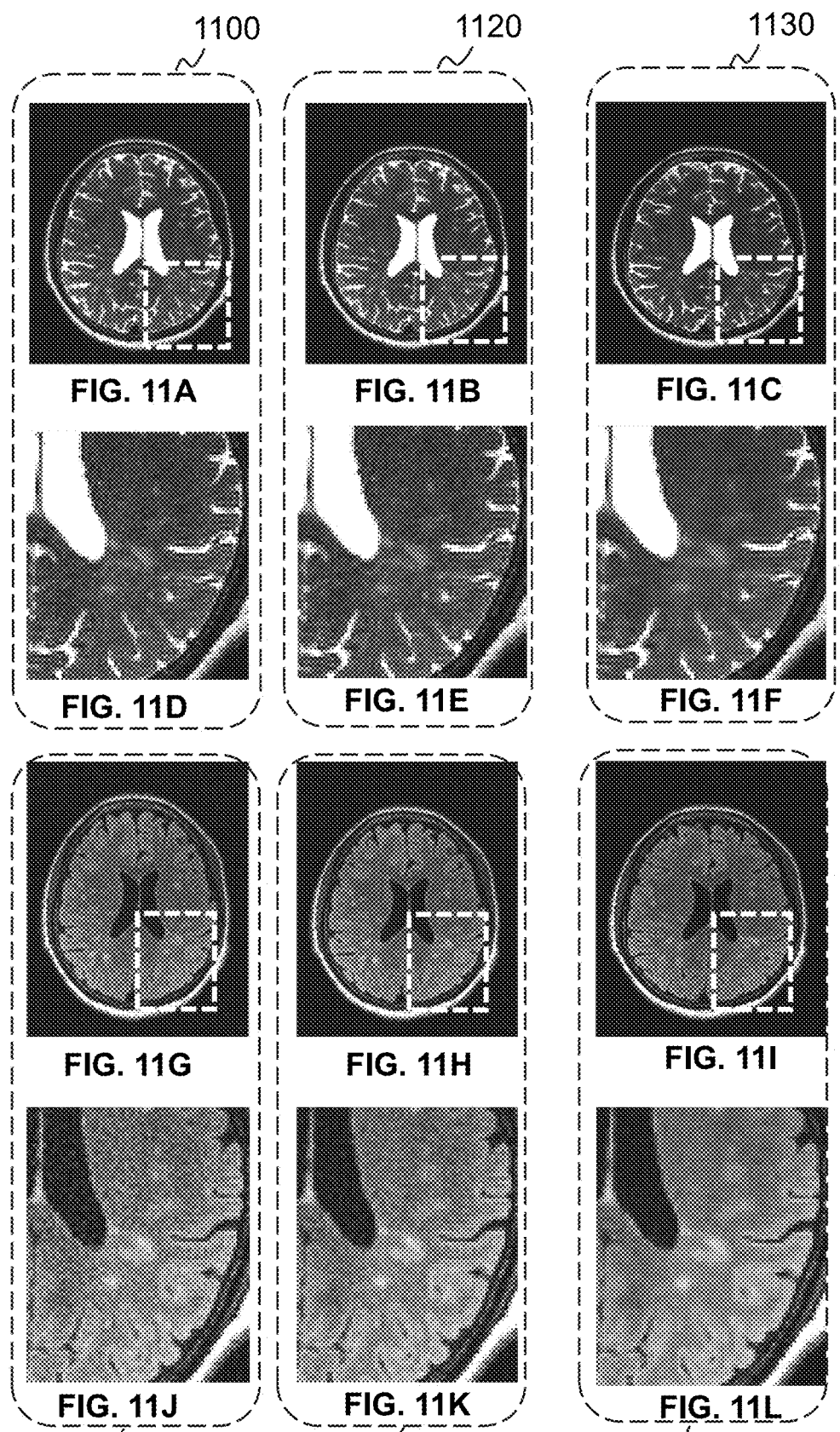

SYSTEM AND METHOD FOR MULTI-CONTRAST MAGNETIC RESONANCE IMAGING

CROSS-REFERENCE TO RELATED APPLICATIONS

This application is a Continuation of International Application No. PCT/CN2018/087731, filed on May 21, 2018, the entire contents of which are hereby incorporated by reference.

TECHNICAL FIELD

The present disclosure generally relates to magnetic resonance imaging (MRI), and more specifically relates to a system and method for multi-contrast magnetic resonance imaging.

BACKGROUND

Magnetic resonance imaging (MRI) is a medical imaging modality that can generate images with multiple contrasts, such as T1, T2, and fluid attenuated inversion recovery (FLAIR), for anatomical and/or functional assessment. In the process of multi-contrast data acquisition for MRI, it may take a relatively long time to capture scan data for reconstructing an image. Therefore, it is desirable to develop a system and/or method for reconstructing quality multi-contrast images that uses less amount of data, which may in turn accelerate the scanning process and make MRI imaging more effectively.

SUMMARY

In one aspect of the present disclosure, a method implemented on a computing device is provided.

In one aspect of the present disclosure, a method implemented on a computing device is provided. The method may include: obtaining a plurality of sets of scan data captured by a magnetic resonance imaging (MRI) device, each set of scan data corresponding to a same scanning area of an object and corresponding to a plurality of scanning characteristics; generating one or more shareable data sets based on the plurality of sets of scan data; generating, based on the one or more shareable data sets, at least one optimized data set for each of the plurality of scanning characteristics; and reconstructing, based on at least one optimized data set for at least one of the plurality of scanning characteristics, the plurality of sets of scan data to obtain a reconstructed image for the at least one scanning characteristic.

In some embodiments, the plurality of scanning characteristics may include a plurality of scanning contrasts.

In some embodiments, the plurality of scanning contrasts may include at least one of T1, T2, or fluid attenuated inversion recovery (FLAIR).

In some embodiments, the plurality of sets of scan data may be a plurality of sets of undersampled k-space scan data, and each set of scan data may correspond to one of the plurality of scanning contrasts.

In some embodiments, the generating one or more shareable data sets based on the plurality of sets of scan data may include: generating a common edge map based on the plurality of sets of k-space scan data; and generating a coil sensitivity map based on the plurality of sets of k-space scan data.

In some embodiments, the generating a common edge map based on the plurality of sets of k-space scan data may include: generating a raw edge map for each of the plurality of scanning contrasts based on the plurality of sets of k-space scan data, wherein the raw edge map includes a raw horizontal edge map and a raw vertical edge map; and generating the common edge map by combining the plurality of raw edge maps.

In some embodiments, the generating a raw edge map for each of the plurality of contrasts may include: for each scanning contrast: obtaining zero-padded k-space data by filling an empty portion of the k-space scan data corresponding to the scanning contrast; generating an MRI image corresponding to the contrast by performing inverse Fourier transform on the zero-padded k-space scan data; determining the raw horizontal edge map and the raw vertical edge map based on the MRI image corresponding to the scanning contrast; and generating the raw edge map based on the raw horizontal edge map and the raw vertical edge map.

In some embodiments, the determining the raw horizontal edge map and the raw vertical edge map based on the MRI image corresponding to the scanning contrast may include: shifting the MRI image horizontally by one or more pixels to obtain a horizontally shifted MRI image; determining a difference image between the MRI image and the horizontally shifted MRI image as the raw horizontal edge map; shifting the MRI image vertically by one or more pixels to obtain a vertically shifted MRI image; and determining a difference image between the MRI image and the vertically shifted MRI image as the raw vertical edge map.

In some embodiments, the generating the common edge map by combining the plurality of raw edges maps may include: determining a first root of sum of squares of the raw horizontal edge maps of the plurality of scanning contrasts; generating a common horizontal edge map based on the first root of sum of squares; determining a second root of sum of squares of the raw vertical edge maps of the plurality of scanning contrasts; generating a common vertical edge map based on the second root of sum of squares; and generating the common edge map based on the common horizontal edge map and the common vertical edge map.

In some embodiments, the generating a coil sensitivity map based on the plurality of sets of k-space scan data may include: generating the coil sensitivity map based on a low-frequency portion of the plurality of sets of k-space scan data.

In some embodiments, the generating the coil sensitivity map based on a low-frequency portion of the plurality of sets of k-space scan data may include: combining the plurality of sets of k-space scan data to obtain a full k-space data; obtaining a low-frequency portion of the full k-space data using a low-pass filter; and generating the coil sensitivity map based on the low-frequency portion of the full k-space data.

In some embodiments, the generating the coil sensitivity map based on a low-frequency portion of the plurality of sets of k-space scan data may include: for each of the plurality of scanning contrasts: obtaining a low-frequency portion of k-space scan data corresponding to the scanning contrast by filtering the k-space scan data of the scanning contrast; determining a root of sum of squares of the plurality of low-frequency portions of k-space scan data of the plurality of scanning contrasts; and generating the coil sensitivity map based on the root of sum of squares of the plurality of low-frequency portions of k-space scan data of the plurality of scanning contrasts.

In some embodiments, the generating, based on the one or more shareable data sets, at least one optimized data set for each of the plurality of scanning characteristics may include: generating, based on the common edge map and the coil sensitivity map, a contrast-specific edge map for each of the plurality of scanning contrast.

In some embodiments, the generating a common edge map based on the plurality of sets of k-space scan data may include: obtaining a set of center k-space data corresponding to a center region of a k-space across all of the plurality of scanning contrasts; constructing a structured matrix based on the set of center k-space data by sliding a patch throughout the set of center k-space data and involving k-space data included in the patch in a row of the structured matrix; extracting a plurality of null space vectors from the structured matrix by performing a singular value decomposition (SVD) of the structured matrix; and generating the common edge map by reshaping the plurality of null space vectors.

In some embodiments, the generating a common edge map based on the plurality of sets of k-space scan data may include: for each scanning contrast: obtaining zero-padded k-space data by filling an empty portion of the k-space scan data corresponding to the scanning contrast; generating an MRI image corresponding to the contrast by performing inverse Fourier transform on the zero-padded k-space scan data; determining an image gradient of the MRI image based on a gradient operator; performing a first singular value decomposition (SVD) on the image gradient to obtain two first unitary matrixes and a singular value of the image gradient; determining a first matrix based on the two first unitary matrixes of each scanning contrast; performing a second SVD on the first matrix to obtain two second unitary matrixes; and generating the common edge map based on the two second unitary matrixes and a sum of squares of the singular values of the image gradient corresponding to each scanning contrast.

According to an aspect of the present disclosure, a system may include a storage device including a set of instructions, and at least one processor in communication with the storage device. When executing the set of instructions, the at least one processor may be directed to cause the system to: obtain a plurality of sets of scan data captured by a magnetic resonance imaging (MRI) device, each set of scan data corresponding to a same scanning area of an object and corresponding to a plurality of scanning characteristics; generate one or more shareable data sets based on the plurality of sets of scan data; generate, based on the one or more shareable data sets, at least one optimized data set for each of the plurality of scanning characteristics; and reconstruct, based on at least one optimized data set for at least one of the plurality of scanning characteristics, the plurality of sets of scan data to obtain a reconstructed image for the at least one scanning characteristic.

According to still another aspect of the present disclosure, a non-transitory computer-readable medium may include at least one set of instructions. When executed by at least one processor of a computer device, the at least one set of instructions may direct the at least one processor to: obtain a plurality of sets of scan data captured by a magnetic resonance imaging (MRI) device, each set of scan data corresponding to a same scanning area of an object and corresponding to a plurality of scanning characteristics; generate one or more shareable data sets based on the plurality of sets of scan data; generate, based on the one or more shareable data sets, at least one optimized data set for each of the plurality of scanning characteristics; and reconstruct, based on at least one optimized data set for at least one of the plurality of scanning characteristics, the plurality of sets of scan data to obtain a reconstructed image for the at least one scanning characteristic.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein:

FIGS. 7A to 7I are schematic diagrams illustrating exemplary multiple single-contrast images of a brain in the axial plane, the coronal plane, and the sagittal plane, respectively, according to some embodiments of the present disclosure;

FIGS. 8A-8C are schematic diagrams illustrating exemplary k-space patterns according to some embodiments of the present disclosure;

FIGS. 10A-10B are an exemplary the horizontal edge map and a corresponding vertical edge map, respectively, according to some embodiments of the present disclosure;

FIGS. 10C-10D are an exemplary enhanced horizontal edge map and a corresponding enhanced vertical edge map, respectively, according to some embodiments of the present disclosure;

FIGS. 10E-10F are an exemplary horizontal edge map and a corresponding vertical edge map, respectively, according to some embodiments of the present disclosure;

FIGS. 10G-10H are an exemplary enhanced horizontal edge map and a corresponding enhanced vertical edge map, respectively, according to some embodiments of the present disclosure;

FIGS. 10J-10K are an exemplary common horizontal edge map and an exemplary common vertical edge map, respectively, according to some embodiments of the present disclosure; and FIGS. 11A to 11L are exemplary reconstructed images according to some embodiments of the present disclosure.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, section or assembly of different level in ascending order. However, the terms may be displaced by another expression if they achieve the same purpose.

Figure 2:
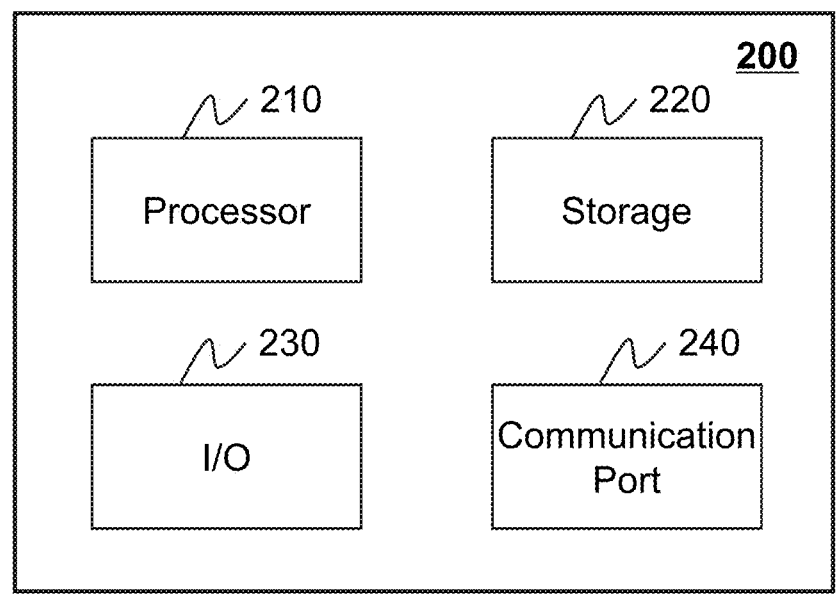
FIG. 2 is a schematic diagram illustrating exemplary hardware and/or software components of an exemplary computing device on which the processing device may be implemented according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or other storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., a processor 210 as illustrated in FIG. 2) may be provided on a computer readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included of connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The following description is provided with reference to an image processing technique for reducing or removing Nyquist ghost artifact. This is not intended to limit the scope the present disclosure. For persons having ordinary skills in the art, a certain amount of variations, changes, and/or modifications may be deducted under the guidance of the present disclosure. Those variations, changes, and/or modifications do not depart from the scope of the present disclosure.

Figure 1:
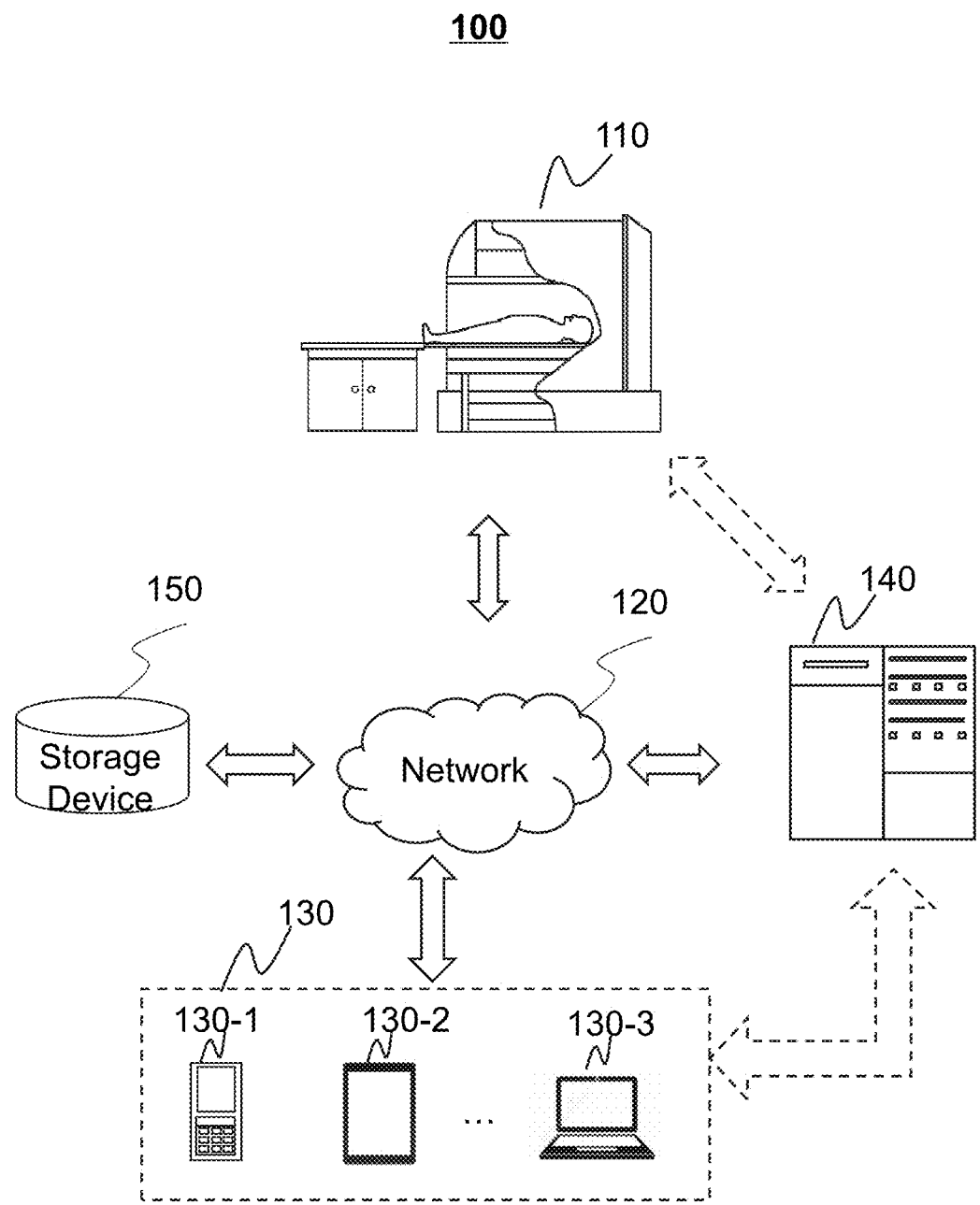
FIG. 1 is a schematic diagram illustrating an exemplary magnetic resonance imaging (MRI) system according to some embodiments of the present disclosure.

FIG. 1 is a schematic diagram illustrating an exemplary magnetic resonance imaging (MRI) system according to some embodiments of the present disclosure. As illustrated, the MRI system 100 may include an MRI scanner 110, a network 120, one or more terminals 130, a processing device 140, and a storage device 150. The components in the MRI system 100 may be connected in one or more of various ways. Merely by way of example, as illustrated in FIG. 1, the MRI scanner 110 may be connected to the processing device 140 through the network 120. As another example, the MRI scanner 110 may be connected to the processing device 140 directly as indicated by the bi-directional arrow in dotted lines linking the MRI scanner and the processing device 140. As a further example, the storage device 150 may be connected to the processing device 140 directly or through the network 120. As still a further example, one or more terminals 130 may be connected to the processing device 140 directly (as indicated by the bi-directional arrow in dotted lines linking the terminal 130 and the processing device 140) or through the network 120.

The MRI scanner 110 may scan a subject located within its detection region and generate a plurality of data relating to the subject. In the present disclosure, "subject" and "object" are used interchangeably. The MRI scanner 110 may include a magnet assembly, a gradient coil assembly, and a radiofrequency (RF) coil assembly (not shown in FIG. 1). In some embodiments, the MRI scanner 110 may be a close-bore scanner or an open-bore scanner.

The magnet assembly may generate a first magnetic field (also referred to as a main magnetic field) for polarizing the subject to be scanned. The magnet assembly may include a permanent magnet, a superconducting electromagnet, a resistive electromagnet, etc. In some embodiments, the magnet assembly may further include shim coils for controlling the homogeneity of the main magnetic field.

The gradient coil assembly may generate a second magnetic field (also referred to as a gradient magnetic field). The gradient coil assembly may be designed for either a close-bore MRI scanner or an open-bore MRI scanner. The gradient coil assembly may include X-gradient coils, Y-gradient coils, and Z-gradient coils. The gradient coil assembly may generate one or more magnetic field gradient pulses to the main magnetic field in the X direction (Gx), Y direction (Gy), and Z direction (Gz) to encode the spatial information of the subject. In some embodiments, the X direction may be designated as a frequency encoding direction, while the Y direction may be designated as a phase encoding direction. In some embodiments, Gx may be used for frequency encoding or signal readout, generally referred to as frequency encoding gradient or readout gradient. In some embodiments, Gy may be used for phase encoding, generally referred to as phase encoding gradient. In some embodiments, Gz may be used for slice selection for obtaining 2D k-space data. In some embodiments, Gz may be used for phase encoding for obtaining 3D k-space data.

The RF coil assembly may include a plurality of RF coils. The RF coils may include one or more RF transmit coils and/or one or more RF receiver coils. The RF transmit coil(s) may transmit RF pulses to the subject. Under the coordinated action of the main magnetic field, the gradient magnetic field, and the RF pulses, MR signals relating to the subject may be generated. The RF receiver coils may receive MR signals from the subject. In some embodiments, one or more RF coils may both transmit RF pulses and receive MR signals at different times. In some embodiments, the function, size, type, geometry, position, amount, and/or magnitude of the RF coil(s) may be determined or changed according to one or more specific conditions. For example, according to the difference in function and size, the RF coil(s) may be classified as volume coils and local coils. The term "volume coil" as used herein generally refers to coils that are used to provide a homogenous RF excitation field across a relative large volume, such as to cover the entire target body. For example, many commercially available MRI scanners include a volume coil that is big enough for whole body imaging of a human subject, thus sometimes is referred to as the "body coil". The term "local coil" as used herein generally refers to coils that are to be placed in close proximity to the region of interest during MR imaging. The local coils may be designed to achieve improved RF detection sensitivity over a small region of interest. In some embodiments, an RF receiver coil may correspond to a channel. The RF receiver coil(s) may receive a plurality of channels of MR signals from the subject. The received MR signal(s) may be sent to the processing device 140 directly or via the network 120 for image reconstruction and/or image processing.

To generate an MRI image, information about the MRI image may not be obtained directly based on a scan. Instead, the plurality of scan data of the subject may be collected in k-space (also referred to herein as k-space scan data), which contains spatial frequency information. The k-space data may be generated by polarizing an object using the main magnetic field of the MRI scanner 110 and then applying an oscillating magnetic field. Once the k-space data are collected, the k-space data may be converted to an image based on Fourier transform. In some embodiments, to accelerate the data acquisition, the MRI scanner 110 may acquire undersampled k-space data rather than fully sampled k-space data during collection. Such undersampled k-space data may represent an undersampled region of k-space. For those skilled in the art, the reduction in the number of k-space samples steps to the Nyquist sampling rate is known as undersampling. In some embodiments, the undersampling may depends on a sampling pattern. The sampling pattern may be characterized by an accelerator factor R. In some embodiments, the sampling pattern may be characterized by various sampling strategies. Exemplary sampling strategies may include random sampling, skewed random sampling, Poisson sampling, or the like, or any combination thereof. In some embodiments, such undersampled k-space data may be collected under different scanning characteristics. Each scan of the different scanning characteristics may correspond to a same scanning area of the object. The same scanning area may include a region of interest that will be shown in the reconstructed images corresponding to each scan. The scanning characteristics may include a scanning contrast. The scanning contrast may refer to an image contrast of an image that is reconstructed using the k-space data. Exemplary scanning contrasts and/or image contrasts may include T1, T2, or FLAIR. Taking image contrast as an example, based on the data acquisition theory of MRI, the undersampled k-space data of an image contrast may be denoted by Equation (1) as follows:

$$d_i = E f_i, \quad (1)$$

where i denotes an index of an image contrast (e.g., i=1, 2, 3 for T1, T2, FLAIR, respectively), $d_i$ denotes the k-space scan data (or k-space data for brevity) corresponding to an MR signal, $f_i$ denotes an MRI image to be reconstructed. $E = C F_u$, where E denotes an encoding operator, C denotes a coil sensitivity map, and $F_u$ denotes an undersampled Fourier operator. There may be a mismatch in the coil sensitivity of the MRI system 100 between coils and object in a specific scan. Therefore, a coil sensitivity map may need to be acquired for a specific scan. Equation (1) may indicate a relation between the k-space scan data and the resulting MRI image. In some embodiments, a user may preset the encoding operator and the undersampled Fourier operator before scanning the object.

In some embodiments, the coil may be a phased array coil with multi-channels. Then the undersampled k-space data of the i-th image contrast may be determined by Equation (2) that is a transformation of Equation (1). Equation (2) may be denoted as follows:

$$d_i = \Sigma_j M F_u^j C_j f_{i,j}, \quad (2)$$

where i denotes an index of an image contrast (e.g., i=1, 2, 3 for T1, T2, FLAIR, respectively), j denotes the index of the channel of the phased array coil, M denotes the number of channels of the phased array coil, $F_u^j$ denotes an undersampled Fourier operator of the j-th channel, $C_j$ denotes a coil sensitivity map of the j-th channel, $f_{i,j}$ denotes an MRI image to be reconstructed corresponding to the j-th channel.

The network 120 may include any suitable network that can facilitate the exchange of information and/or data for the MRI system 100. In some embodiments, one or more components of the MRI system 100 (e.g., the MRI scanner 110, the terminal(s) 130, the processing device 140, or the storage device 150) may communicate information and/or data with one or more other components of the MRI system 100 via the network 120. For example, the processing device 140 may obtain a plurality of scan data (i.e., MR signals) from the MRI scanner 110 via the network 120. As another example, the processing device 140 may obtain user instructions from the terminal(s) 130 via the network 120. In some embodiments, the network 120 may be any type of wired or wireless network, or a combination thereof. The network 120 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 120 may include a cable network, a wireline network, a fiber-optic network, a tele-communications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 120 may include one or more network access points. For example, the network 120 may include wired and/or wireless network access points such as base stations and/or internet exchange points through which one or more components of the MRI system 100 may be connected to the network 120 to exchange data and/or information.

The terminal 130 include a mobile device 130-1, a tablet computer 130-2, a laptop computer 130-3, or the like, or any combination thereof. In some embodiments, the mobile device 130-1 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, smart foot-gear, a pair of smart glasses, a smart helmet, a smart watch, smart clothing, a smart backpack, a smart accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google Glass, an Oculus Rift, a Hololens, a Gear VR, etc. In some embodiments, the terminal(s) 130 may remotely operate the MRI scanner 110. In some embodiments, the terminal(s) 130 may operate the MRI scanner 110 via a wireless connection. In some embodiments, the terminal(s) 130 may receive information and/or instructions inputted by a user, and send the received information and/or instructions to the MRI scanner 110 or to the processing device 140 via the network 120. In some embodiments, the terminal(s) 130 may receive data and/or information from the processing device 140. In some embodiments, the terminal(s) 130 may be part of the processing device 140. In some embodiments, the terminal(s) 130 may be omitted.

The processing device 140 may process data and/or information obtained from the MRI scanner 110, the terminal(s) 130, and/or the storage device 150. The data may include or relate to k-space scan data corresponding to MR signals. For example, the processing device 140 may process a plurality of sets of scan data obtained from the MRI scanner 110, and generate a coil sensitivity map based on the plurality of sets of scan data. As another example, the processing device 140 may generate one or more shareable data sets based on the plurality of sets of scan data, for example, a common edge map. The one or more shareable data sets may be used in image reconstruction of multiple images under different scanning characteristics due to, e.g., different scanning settings. Furthermore, the processing device 140 may generate a contrast-specific edge map corresponding to each of multiple contrast MRI images, and reconstruct images having different contrasts (e.g., T1 image, T2 image, or FLAIR image). In some embodiments, a reconstructed image may be transmitted to the terminal(s) 130 and displayed on one or more display components in the terminal(s) 130.

In some embodiments, the processing device 140 may be a single server, or a server group. The server group may be centralized, or distributed. In some embodiments, the processing device 140 may be local or remote. For example, the processing device 140 may access information and/or data stored in the MRI scanner 110, the terminal(s) 130, and/or the storage device 150 via the network 120. As another example, the processing device 140 may be directly connected to the MRI scanner 110, the terminal(s) 130, and/or the storage device 150 to access stored information and/or data. In some embodiments, the processing device 140 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 140 may be implemented on a computing device 200 having one or more components illustrated in FIG. 2 in the present disclosure.

The storage device 150 may store data and/or instructions. In some embodiments, the storage device 150 may store data obtained from the terminal(s) 130 and/or the processing device 140. In some embodiments, the storage device 150 may store data and/or instructions that the processing device 140 may execute or use to perform exemplary methods described in the present disclosure. In some embodiments, the storage device 150 may include a mass storage device, a removable storage device, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 150 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 150 may be connected to the network 120 to communicate with one or more components of the MRI system 100 (e.g., the processing device 140, the terminal(s) 130, etc.). One or more components of the MRI system 100 may access the data or instructions stored in the storage device 150 via the network 120. In some embodiments, the storage device 150 may be directly connected to or communicate with one or more components of the MRI system 100 (e.g., the processing device 140, the terminal(s) 130, etc.). In some embodiments, the storage device 150 may be part of the processing device 140.

FIG. 2 is a schematic diagram illustrating exemplary hardware and/or software components of an exemplary computing device 200 on which the processing device 140 may be implemented according to some embodiments of the present disclosure. As illustrated in FIG. 2, the computing device 200 may include a processor 210, a storage 220, an input/output (I/O) 230, and a communication port 240.

The processor 210 may execute computer instructions (program code) and perform functions of the processing device 140 in accordance with techniques described herein. The computer instructions may include, for example, routines, programs, objects, components, signals, data structures, procedures, modules, and functions, which perform particular functions described herein. The processor 210 may process data obtained from the MRI scanner 110, the terminal(s) 130, the storage device 150, and/or any other component of the MRI system 100. For example, the processing device 140 may process a plurality of sets of scan data obtained from the MRI scanner 110, and generate a coil sensitivity map based on the plurality of sets of scan data. As another example, the processing device 140 may generate one or more priors (also referred to as "shareable data sets" in the present disclosure) based on the plurality of sets of scan data, for example, a coil sensitivity profile (also referred to as a coil sensitivity map), an edge map by introducing weights into total variation prior which exploits the fact that the structure in terms of edge is likely to be correlated among the multiple contrasts (also referred to as a common edge map), and Wavelet sparsity, etc. Furthermore, the processing device 140 may generate a contrast-specific edge map corresponding to each of the multiple contrast MRI images, and reconstruct images having different contrasts (e.g., T1 image, T2 image, or FLAIR image). In some embodiments, the reconstructed image may be stored in the storage device 150, the storage 220, etc. In some embodiments, the reconstructed image may be displayed on a display device by the I/O 230. In some embodiments, the processor 210 may perform instructions obtained from the terminal(s) 130. In some embodiments, the processor 210 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 200. However, it should be noted that the computing device 200 in the present disclosure may also include multiple processors, thus operations and/or method steps that are performed by one processor as described in the present disclosure may also be jointly or separately performed by the multiple processors. For example, if in the present disclosure the processor of the computing device 200 executes both process A and process B, it should be understood that process A and process B may also be performed by two or more different processors jointly or separately in the computing device 200 (e.g., a first processor executes process A and a second processor executes process B, or the first and second processors jointly execute processes A and B).

The storage 220 may store data/information obtained from the MRI scanner 110, the terminal 130, the storage device 150, or any other component of the MRI system 100. In some embodiments, the storage 220 may include a mass storage device, a removable storage device, a volatile read-and-write memory, a read-only memory (ROM), or the like, or any combination thereof. For example, the mass storage may include a magnetic disk, an optical disk, a solid-state drive, etc. The removable storage may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 220 may store one or more programs and/or instructions to perform exemplary methods described in the present disclosure. For example, the storage 220 may store a program for the processing device 140 for reconstructing an MRI image.

The I/O 230 may input or output signals, data, and/or information. In some embodiments, the I/O 230 may enable a user interaction with the processing device 140. In some embodiments, the I/O 230 may include an input device and an output device. Exemplary input devices may include a keyboard, a mouse, a touch screen, a microphone, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 240 may be connected to a network (e.g., the network 120) to facilitate data communications. The communication port 240 may establish connections between the processing device 140 and the MRI scanner 110, the terminal 130, or the storage device 150. The connection may be a wired connection, a wireless connection, or combination of both that enables data transmission and reception. The wired connection may include an electrical cable, an optical cable, a telephone wire, or the like, or any combination thereof. The wireless connection may include Bluetooth, Wi-Fi, WiMax, WLAN, ZigBee, mobile network (e.g., 3G, 4G, 5G, etc.), or the like, or a combination thereof. In some embodiments, the communication port 240 may be a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
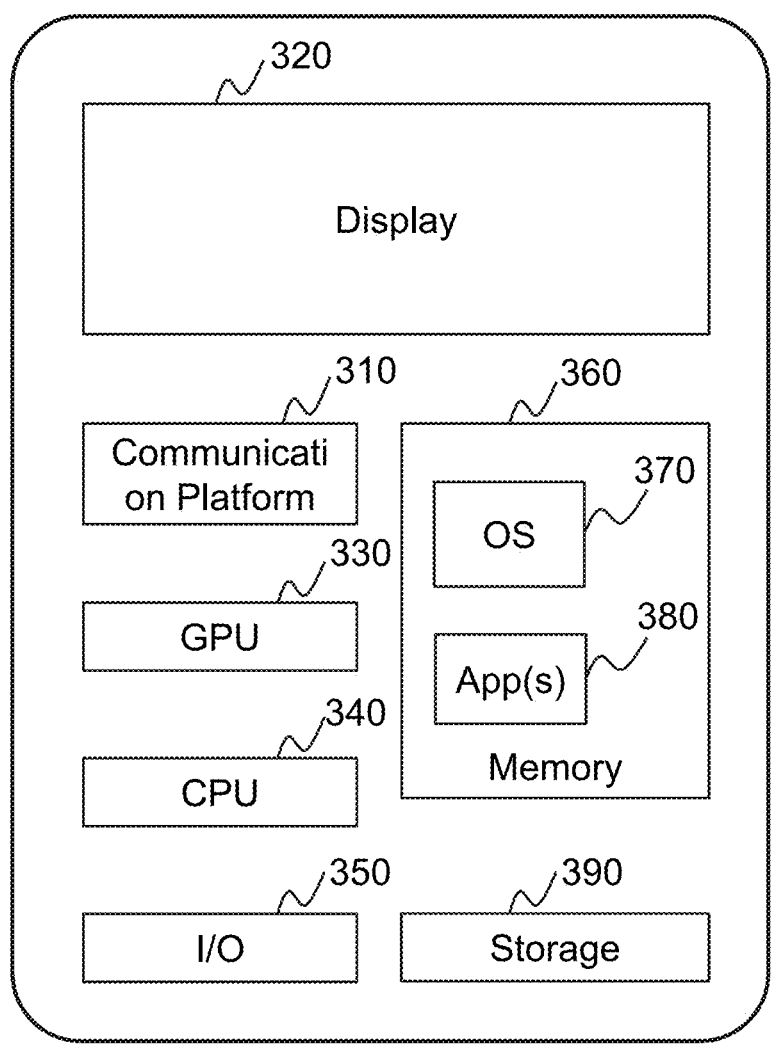
FIG. 3 is a schematic diagram illustrating exemplary hardware and/or software components of an exemplary mobile device according to some embodiments of the present disclosure.

FIG. 3 is a schematic diagram illustrating exemplary hardware and/or software components of an exemplary mobile device 300 according to some embodiments of the present disclosure. As illustrated in FIG. 3, the mobile device 300 may include a communication platform 310, a display 320, a graphic processing unit (GPU) 330, a central processing unit (CPU) 340, an I/O 350, a memory 360, and storage 390. In some embodiments, any other suitable component, including but not limited to a system bus or a controller (not shown), may also be included in the mobile device 300. In some embodiments, a mobile operating system 370 (e.g., iOS, Android, Windows Phone, etc.) and one or more applications 380 may be loaded into the memory 360 from the storage 390 in order to be executed by the CPU 340. The applications 380 may include a browser or any other suitable mobile apps for receiving and rendering information relating to image processing or other information from the processing device 140. User interactions with the information stream may be achieved via the I/O 350 and provided to the processing device 140 and/or other components of the MRI system 100 via the network 120.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to generate an image with reduced Nyquist ghost artifact as described herein. A computer with user interface elements may be used to implement a personal computer (PC) or other type of work station or terminal device, although a computer may also act as a server if appropriately programmed. It is believed that those skilled in the art are familiar with the structure, programming and general operation of such computer equipment and as a result the drawings should be self-explanatory.

In an MRI examination, multiple sets of scan data of various image contrasts such as T1, T2, and FLAIR, etc., may be acquired. Despite the versatile nature of MRI, multi-contrast data acquisition may be highly time consuming particularly when 3D encoding is needed. Some sharable information over the contrast dimension may be applied to the image reconstruction for addressing this issue. As used herein, the contrast dimension refers to the multi-contrast. The sharable information may include an edge information, coil sensitivity information, or the like, or a combination thereof. In some embodiments, the coil sensitivity information may be consistent considering that a same MRI scanner that acquires multiple sets of scan data corresponding to various image contrasts, such as T1, T2, and FLAIR, uses the same coils of the same MRI scanner in the data acquisition. A coil sensitivity map may be estimated based on fully sampled k-space scan data corresponding to each of the multiple single-contrast images. According to some embodiments, full sampled k-space scan data may be generated by combining undersampled k-space scan data of the multiple single-contrast images. The acquisition of undersampled k-space scan data of each of multiple contrasts, compared to the acquisition of fully sampled k-space data of each of multiple contrasts, may reduce the time for k-space data acquisition, thereby reducing the time of an MRI scan.

At least some information embedded in the acquired data sets corresponding to different single-contrast images, such as a T1 contrast image (or referred to as T1 image for brevity), a T2 contrast image (or referred to as T2 image for brevity), or an FLAIR contrast image (or referred to as FLAIR image for brevity), may be sharable in the generation of the full sampled k-space scan data. For exemplary sharable edge structures as illustrated in FIGS. 7A-7I, three T1 images in FIG. 7A, FIG. 7D, and FIG. 7G in a dashed box 710 are images of the brain in the axial plane, the coronal plane, and the sagittal plane, respectively; three T2 images in FIG. 7B, FIG. 7E, and FIG. 7H in a dashed box 720 are images of the brain in the axial plane, the coronal plane, and the sagittal plane, respectively; three FLAIR images in FIG. 7C, FIG. 7F, and FIG. 7I in a dashed box 730 are images of the brain in the axial plane, the coronal plane, and the sagittal plane, respectively. A comparison among the three single-contrast images in the same plane, for example, FIGS. 7A, 7B, and 7C, indicates that the edge structure of the three single-contrast images may be consistent or similar to some extent. Likewise, the edge structures of FIGS. 7D, 7E, and 7F or FIGS. 7G, 7H, and 7I may be consistent or similar to some extent. Accordingly, in some embodiments of the present disclosure, a common edge structure may be applied to k-space scan data of each of multiple contrasts to reconstruct a multi-contrast MRI image. The use of sharable information in the reconstruction of an image for each of multiple contrasts may reduce the computational cost of the image reconstruction.

In addition, the images are reconstructed using regularized inversion. For instance, the images are reconstructed using an edge map weighted regularized inversion (also referred to as spatial adaptive priors) to find a solution by exploiting the shareable information in the contrast dimension.

Figure 4:
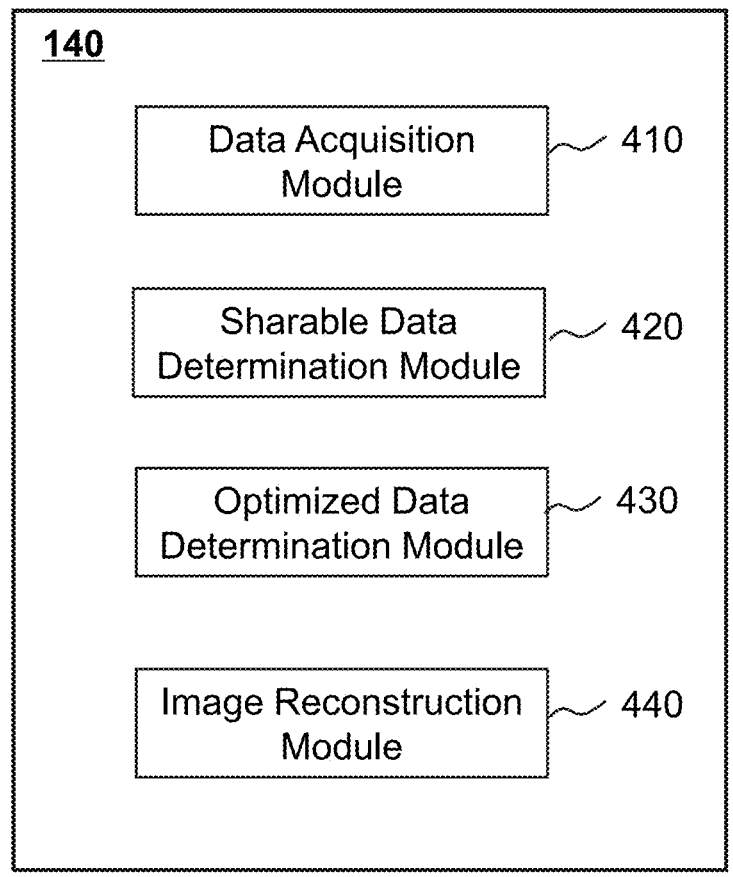
FIG. 4 is a block diagram illustrating an exemplary processing device according to some embodiments of the present disclosure.

FIG. 4 is a block diagram illustrating an exemplary processing device 140 according to some embodiments of the present disclosure. At least a portion of the processing device 140 may be implemented on the computing device 200 (e.g., the processor 210) illustrated in FIG. 2 or the mobile device 300 as illustrated in FIG. 3. The processing device 140 may include a data acquisition module 410, a sharable data determination module 420, an optimized data determination module 430, and an image reconstruction module 440.

The data acquisition module 410 may be configured to obtain image data. The obtained image data may include k-space data. In some embodiments, the data acquisition module 410 may acquire the image data (e.g., scan data) from the MRI scanner 110, the storage device 150, the terminal(s) 130, and/or an external data source (not shown). In some embodiments, the image data may include a plurality of sets of scan data captured by the MRI scanner 110. Each of the plurality of sets of scan data may correspond to a same scanning area of an object and a set of scanning characteristics. A set of scanning characteristics may include different scanning contrasts. For example, the scanning contrasts may include T1, T2, FLAIR, or the like, or any combination thereof. In some embodiments, the obtained plurality of sets of scan data may represent undersampled regions of the k-space data. For example, the data acquisition module 410 may obtain a first k-space scan data set representing a first undersampled region of the k-space data for the T1 contrast, a second k-space scan data set representing a second undersampled region of the k-space data for T2 contrast, a third k-space scan data set representing a third undersampled region of the k-space data for the FLAIR contrast. In some embodiments, any one of the first undersampled region, the second undersampled region and/or the third undersampled region may at least partially overlap with one or two of the other undersampled regions. In some embodiments, the first undersampled region, the second undersampled region and/or the third undersampled region do not overlap with each other. In some embodiments, the data acquisition module 410 may acquire instructions for processing the obtained plurality of sets of scan data. The acquired instructions may be executed by the processor(s) of the processing device 140 to perform exemplary methods described in this disclosure. In some embodiments, the acquired scan data may be transmitted to the storage device 150, the storage 220, and/or the memory 360, to be stored.

The sharable data determination module 420 may be configured to generate one or more sharable data sets based on the plurality of sets of scan data. In some embodiments, the sharable data sets may include a coil sensitivity map, a common edge map, or the like, or a combination thereof. The sharable data determination module 420 may generate the coil sensitivity map based on the undersampled k-space scan data of each contrast (e.g., T1, T2, or FLAIR). In some embodiments, the sharable data determination module 420 may generate the full k-space data by combining the undersampled k-space scan data of each contrast. The sharable data determination module 420 may further obtain low-frequency data of the full k-space by using a low-pass filter (LPF). The sharable data determination module 420 may generate the coil sensitivity map by performing the inverse Fourier transform on the low-frequency data. In some embodiments, the sharable data determination module 420 may obtain a low-frequency portion of the k-space of each contrast respectively. The sharable data determination module 420 may determine a root of sum of squares (rSoS) of the low-frequency data of the k-space of each contrast, and generate the coil sensitivity map based on the rSoS.

In some embodiments, the sharable data determination module 420 may generate the common edge map based on the undersampled k-space scan data of each contrast (e.g., T1, T2, or FLAIR). In some embodiments, the sharable data determination module 420 may determine raw edge maps of multiple contrasts, and determine enhance edge maps based on the raw edge maps. The sharable data determination module 420 may further generate the common edge map by combining the raw edge maps and/or the enhanced edge maps. The sharable data determination module 430 may transmit the determined coil sensitivity map and common edge map to other components of the processing device 140 (e.g., the optimized data determination module 430) for further processing. More description of sharable data determination module 420 may be found everywhere in the present disclosure (e.g., FIG. 5 and the descriptions thereof).

The optimized data determination module 430 may be configured to generate at least one optimized data set for each of a plurality of scanning characteristics respectively. In some embodiments, the optimized data set may refer to an optimized edge map. In some embodiments, the optimized edge map may be a contrast-specific edge map of each contrast (e.g., T1, T2, or FLAIR). The optimized data determination module 430 may determine the contrast-specific edge map of each contrast based on the sharable data sets, such as the common edge map and the coil sensitivity map. The optimized data determination module 430 may determine the contrast-specific edge map based on Equations (8) and (9) as described below. The optimized data determination module 430 may transmit the determined contrast-specific edge maps to the image reconstruction module 440 to be used in image reconstruction.

The image reconstruction module 440 may be configured to obtain a reconstructed image based on the plurality of sets of scan data (or a portion thereof) and the at least one optimized data set. The image reconstruction module 440 may reconstruct each of the multiple single-contrast images by exploiting the corresponding contrast-specific edge map. For instance, the image reconstruction module 440 may reconstruct the each of the multiple single-contrast images based on Equation (10) as described below.

It should be noted that the above description of the processing engine is provided for the purposes of illustration, and is not intended to limit the scope of the present disclosure. For persons having ordinary skills in the art, multiple variations and modifications may be made under the teachings of the present disclosure. However, those variations and modifications do not depart from the scope of the present disclosure. For example, the optimized data determination module 430 and the image reconstruction module 440 may be integrated into a single module. In some embodiments, one or more of the modules may be implemented on a different device separated from the device on which other modules are implemented. Merely by way of example, the image reconstruction module 440 may be implemented on a first computing device, and other modules may be implemented on a second computing device in communication with the first computing device.

Figure 5:
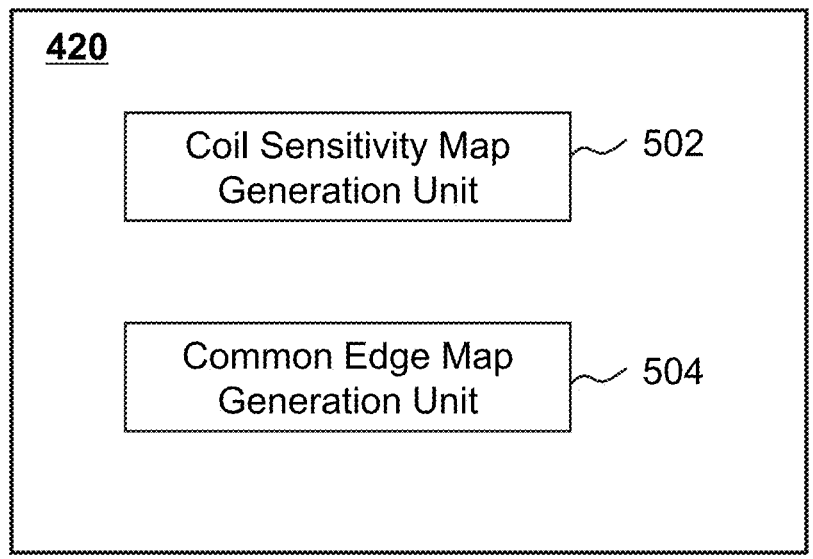
FIG. 5 is a block diagram illustrating an exemplary sharable data determination module according to some embodiments of the present disclosure.

FIG. 5 is a block diagram illustrating an exemplary sharable data determination module 420 according to some embodiments of the present disclosure. The sharable data determination module 420 may be implemented on the computing device 200 (e.g., the processor 210) illustrated in FIG. 2 or the mobile device 300 as illustrated in FIG. 3. The sharable data determination module 420 may include a coil sensitivity map generation unit 502 and a common edge map generation unit 504.

The coil sensitivity map generation unit 502 may be configured to generate the coil sensitivity map based on the undersampled k-space scan data of each contrast of one or more contrasts (e.g., T1, T2, or FLAIR). In some embodiments, the coil sensitivity map generation unit 502 may generate a coil sensitivity map based on a low-frequency portion of full k-space data of one or more contrasts. The coil sensitivity map generation unit 502 may generate the full k-space data by combining the undersampled k-space scan data of each contrast. As used herein, the full k-space data represent that all data point of the k-space data are filled. The coil sensitivity map generation unit 502 may obtain a low-frequency portion of the full k-space data by using a low-pass filter (LPF). Exemplary low-pass filters may include an ideal low-pass filter (ILPF), a Butterworth low-pass filter (BLPF), a Gaussian low-pass filter, or the like, or any combination thereof. In some embodiments, the coil sensitivity map generation unit 502 may set a filter cutoff frequency for the low-pass filter. For example, the filter cutoff frequency may be determined according to the frequency with the index having a low singular value near zero. The k-space scan data whose frequency exceeds the filter cutoff frequency may be filtered out by the low-pass filter, while the k-space scan data whose frequency is lower than the filter cutoff frequency may be retained for further processing to determine a coil sensitivity map. The coil sensitivity map generation unit 502 may obtain the low-frequency portion of the full k-space data and generate the coil sensitivity map by performing the inverse Fourier transform on the low-frequency portion of the full k-space data.

In some embodiments, the coil sensitivity map generation unit 502 may generate a coil sensitivity map based on a combination of a low-frequency portion of k-space data of each contrast of one or more contrasts. The coil sensitivity map generation unit 502 may obtain low-frequency portion of the k-space data of each contrast separately. The coil sensitivity map generation unit 502 may generate the coil sensitivity map based on a combination of the low-frequency portion(s) of the k-space data of each of the one or more contrasts. For example, the coil sensitivity map generation unit 502 may generate a combination of the low-frequency portion(s) of the k-space data of each of the one or more contrasts by determining a rSoS of the low-frequency portion(s) of the k-space data of each contrast of the one or more contrasts, and then generate the coil sensitivity map by performing the inverse Fourier transform on the rSOS.

The common edge map generation unit 504 may be configured to generate the common edge map based on the undersampled k-space scan data of each contrast (e.g., T1, T2, or FLAIR). In some embodiments, the common edge map generation unit 504 may fill an empty portion of the k-space with a constant, e.g., zero, so that the dimension of the k-space is equal to the dimension of the image to be reconstructed. In some embodiments, the common edge map generation unit 504 may generate an MRI image (e.g., FIG. 9B) by performing inverse Fourier transform on the zero-padded k-space. The common edge map generation unit 504 may determine a raw horizontal edge map and a raw vertical edge map based on the MRI image. As disclosed elsewhere in the present disclosure, the processor may shift the MRI image to obtain a shifted MRI image. If the shift is a horizontally shift, the processor may determine a difference image between the MRI image and the horizontally shifted MRI image as the raw horizontal edge map (e.g., FIG. 9C). The raw vertical edge map may be obtained similarly as the raw horizontal edge map except shift the MRI image vertically by the processor (e.g., FIG. 9D). In some embodiments, the common edge map generation unit 504 may further enhance the edges in the raw horizontal edge map and the raw vertical edge map based on a filtering algorithm (e.g., inverse filtering). The common edge map generation unit 504 may determine the common edge map by combining the enhanced edge maps of multiple contrasts. Details about the combining the enhanced edge maps of multiple contrasts may be found elsewhere in the present disclosure (e.g., FIG. 6, and the descriptions thereof).

In some embodiment, the common edge map generation unit 504 may obtain the k-space data in a center region of k-space across all contrasts (i.e., T1, T2, and FLAIR). In some embodiments, the center region of k-space may be an autocalibration (AC) region. The AC region may refer to a certain number of phase lines in the center region of k-space. The user may specify the AC region before the scanning process. The processor may construct a structured matrix based on the k-space data. The processor may determine the common edge map based on the structure matrix. Details about generating the common edge map may be disclosed elsewhere in the present disclosure (e.g., FIG. 6, and the descriptions thereof).

In some embodiments, the common edge map generation unit 504 may generate the common edge map by way of spectral decomposition of the image. When the low spatial frequencies form k-space are suppressed, little contrast appears in the image, yet edge definition remains. It is exploiting the fact that the fine details of the image such as edges are contained in the high spatial frequency portion that are in the peripheries of k-space. In some embodiments, the peripheries of k-space including the high spatial frequency portion may be determined based on a high-pass filtering by a high-pass filter. The common edge map generation unit 504 may set a cutoff frequency for the high-pass filter. The k-space data whose frequency exceeds the cutoff filter may be determined to be the high spatial frequency portion. The common edge map generation unit 504 may generate an MRI image by performing inverse Fourier transform on the zero-padded k-space of a single contrast (also referred to as a single contrast image). The processor may determine an image gradient for the single contrast image based on the gradient operator. The common edge map generation unit 504 may then perform a singular value decomposition (SVD) for a first time on the image gradient of the single contrast image to obtain a matrix Z. The common edge map generation unit 504 may then further perform SVD of the matrix Z for a second time. The common edge map generation unit 504 may generate the common edge map based on the first time SVD and second time SVD. Details about generating the common edge map may be disclosed elsewhere in the present disclosure (e.g., FIG. 6, and the descriptions thereof).

Figure 6:
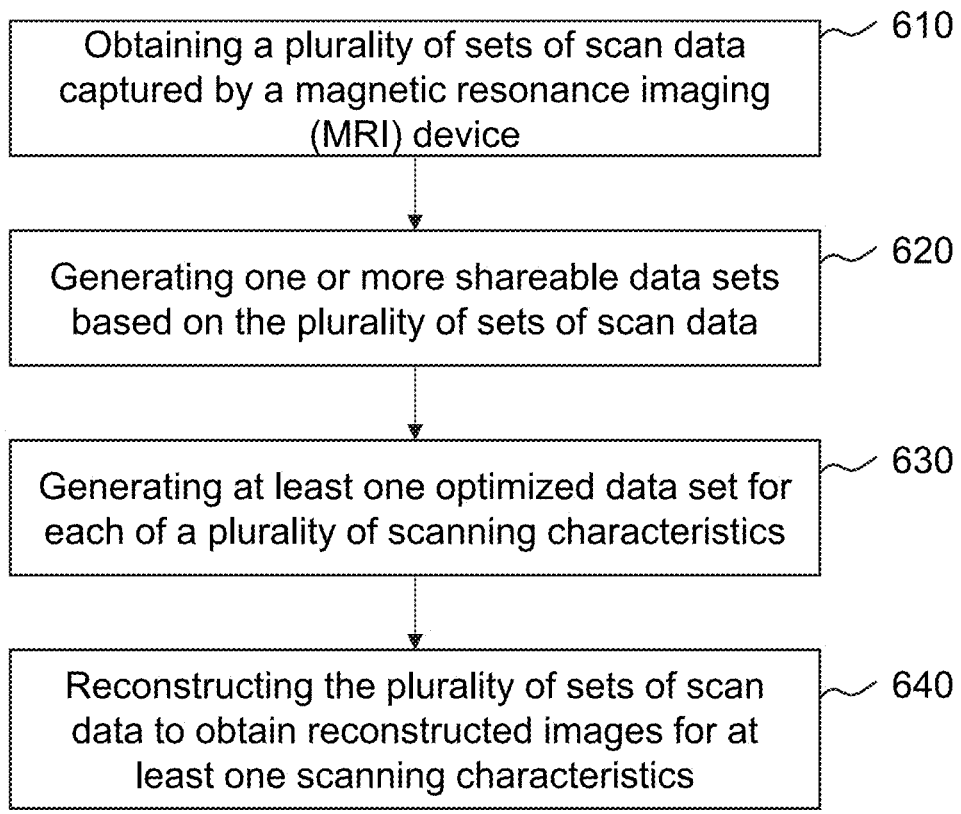
FIG. 6 is a flowchart illustrating an exemplary process for reconstructing multiple single-contrast images of an object according to some embodiments of the present disclosure.

FIG. 6 is a flowchart illustrating an exemplary process for reconstructing multiple single-contrast images of an object according to some embodiments of the present disclosure. In some embodiments, one or more operations of process 600 illustrated in FIG. 6 for reconstructing images of an object may be implemented in the MRI system 100 illustrated in FIG. 1. For example, the process 600 illustrated in FIG. 6 may be stored in the storage device 150 in the form of instructions, and invoked and/or executed by the processing device 140 (e.g., the processor 210 of the computing device 200 as illustrated in FIG. 2, the CPU 340 of the mobile device 300 as illustrated in FIG. 3). As another example, a portion of the process 600 may be implemented on the MRI scanner 110. The operations of the illustrated process presented below are intended to be illustrative. In some embodiments, the process may be accomplished with one or more additional operations not described, and/or without one or more of the operations discussed. Additionally, the order in which the operations of the process as illustrated in FIG. 6 and described below is not intended to be limiting.

In 610, the processor (e.g., the data acquisition module 410 of the processing device 140) may obtain a plurality of sets of scan data captured by a magnetic resonance imaging (MRI) device (e.g., the MRI scanner 110). The MRI scanner 110 may scan an object or a portion of the object according to a plurality of scanning characteristics. The processor may obtain the plurality of sets of scan data corresponding to the plurality of scanning characteristics from the MRI scanner 110 or from a storage device (e.g., the storage 220). The plurality of scanning characteristics may include a plurality of scanning contrasts, a plurality of scanning time, or the like, or a combination thereof. The plurality of scanning contrasts may include T1, T2, FLAIR, or the like, or any combination thereof. In some embodiments, the MRI scanner 110 may scan the object based on a plurality of MRI sequences, and generate the plurality of sets of scan data. The plurality of MRI sequences may be specific settings of pulse sequences and pulsed field gradients (PFG). Exemplary MRI sequences may include T1-weighted (or T1) sequence, T2-weighted (or T2) sequence, proton density (PD) weighted sequence, FLAIR sequence, or the like, or any combination thereof. For example, the MRI scanner 110 may generate scan data of T1 contrast corresponding to the T1 sequence. The MRI scanner 110 may generate scan data of T2 contrast corresponding to the T2 sequence. The MRI scanner 110 may generate scan data of FLAIR contrast corresponding to the FLAIR sequence.

The obtained scan data may be k-space data (also referred to as k-space scan data herein). MRI data may be collected in k-space. K-space data may be generated by using spatially varying magnetic field gradients superimposed on the main magnetic field of the MRI scanner (e.g., the MRI scanner 110). For example, when the MRI scanner 110 scans an object, the MRI scanner 110 may collect a plurality of MR signals corresponding to a scanning area of the object, and fill the k-space based on the collected MR signals. In some embodiments, the MRI scanner 110 may fill the MR signals to a grid of points in k-space line by line.

FIGS. 8A to 8C illustrates exemplary k-space according to some embodiments of the present disclosure. As illustrated in FIGS. 8A-8C, the $K_x$ direction of the k-space represents a frequency encoding direction, the $K_y$ direction of the k-space represents a phase encoding direction, a k-space point 801 of the k-space represents a sampled scan data point corresponding to a MR signal. The $K_x$ and $K_y$ axes of k-space may correspond to the horizontal (x-) and vertical (y-) axes of an image reconstructed based on the k-space data. A line in the k-space may represent a phase encoding line, for example, line 4, line 3, etc. The dimension of k-space (e.g., 256×256) may be equal to the dimension of the image to be reconstructed (e.g., 256×256). A k-space data point may contain spatial frequency and phase information about every pixel in the image to be reconstructed.

In some embodiments, the MRI scanner 110 may collect the MR signals based on a sampling pattern (e.g., FIGS. 8A-8B). The sampling pattern may include the sampling rate and a location of each of the sampled data point in the k-space. The sampling rate refers to a ratio of the amount of desired sampled data to the amount of full k-space data. For example, if the number of full k-space data is 256×256, the number of desired sampled data is 128×256, the sampling rate is 0.5 (i.e., (128×256)/(256×256)). The MRI scanner 110 may further convert the collected MR signals to corresponding k-space data. Full k-space data may be obtained based on a sampling pattern in which all data included in the k-space need to be filled. However, it is time-consuming to sample full k-space data due to the volume of data generated in the process of scanning the object. In some embodiments, to accelerate the scanning process, the MRI scanner 110 may undersample the k-space data based on a sampling pattern in which a part of k-space data need to be filled. For example, based on the sampling pattern as illustrated in FIG. 8A, the MRI canner 110 may collect MR signals to fill the data in even lines of the k-space (e.g., line 4, line 2, line 0, line −2, line −4) under the effect of T1 weighted sequence, which may be referred as the undersampling. As another example, based on the sampling pattern as illustrated in FIG. 8B, the MRI scanner 110 may collect MR signals to fill data in odd lines of the k-space (e.g., line 3, line 1, line −3, line −1) under the effect of T2 weighted sequence.

In some embodiments, a user may design the sampling pattern based on an accelerator factor R. The accelerator factor R may be defined as the ratio of the amount of k-space data needed for a fully sampled image to the amount of k-space data collected in an accelerated acquisition by way of, e.g., undersampling. The MRI scanner 110 may collect MR signals once every R phase encoding steps. A phase encoding step may refer to a step between every two adjacent phase encoding lines (e.g., the phase encoding step 802 between the line 4 and line 3). For example, if every other line in k-space is collected, the accelerator factor R is 2. The accelerator factor corresponding to the sampling patterns as illustrated in FIGS. 8A and 8B is 2. In some embodiments, the user may design the sampling pattern based on a sampling strategy. Exemplary sampling strategies may include random sampling, skewed random sampling, Poisson sampling, or the like, or any combination thereof.

For those skilled in the art, once the k-space scan data are collected, the processor may convert the k-space scan data to an image by image reconstruction involving inverse Fourier transform. As mentioned above, it is time-consuming for the MRI scanner 110 to collect all of the k-space data directly. Undersampling the k-space data by collecting fewer phase encoding lines in k-space may accelerate the scanning process. A reduced amount of k-space scan data may also reduce the time for image processing. To acquire a sufficient amount of data in order to obtain an image of a desirable quality while reducing the time for the scanning process and image processing, the user may preset the amount of undersampled k-space data based on an empirical value. In some embodiments, the empirical value may depend on the image quality of the image to be reconstructed. For example, the image quality may include the root mean square error (RMSE), the signal noise ratio (SNR), visual quality, or the like, or any combination thereof. In some embodiments, according to the compressed sensing (CS) theory, the empirical value may depend on a complexity, $O(TK+TK \log(N/K))$, where T denotes the number/count of different contrasts (e.g., 1, 2, 3), K denotes the sparsity number that is the number of non-zero-valued elements of a sparse matrix (e.g., the image to be reconstructed) which represents a sparsity degree, and N denotes the number of pixels (or pixel count) of the image to be reconstructed.

To obtain multiple single-contrast images, the MRI scanner 110 may perform scans based on multiple MRI sequences. For example, the MRI scanner 110 may perform a scan based on a T1 weighted sequence. The MRI scanner 110 may scan the object (or the portion of the object) and collect a first k-space scan data set representing a first undersampled region of the k-space data. The first undersampled region may correspond to a first sampling pattern. The MRI scanner 110 may scan the object based on the first sampling pattern to obtain the first k-space scan data set. Similarly, the MRI scanner 110 may perform a scan based on a T2 weighted sequence. The MRI scanner 110 may scan the same object (or the same portion of the object) and collect a second k-space scan data set representing a second undersampled region of the k-space data. The second undersampled region may correspond to a second sampling pattern. The MRI scanner 110 may scan the object based on the second sampling pattern to obtain the second k-space scan data set. The MRI scanner 110 may perform a scan based on a FLAIR sequence. The MRI scanner 110 may scan the same object (or the same portion of the object) and collect a third k-space scan data set representing a third undersampled region of the k-space data. The third undersampled region may correspond to a third sampling pattern. The MRI scanner 110 may scan the object based on the third sampling pattern to obtain the third k-space data set. In some embodiments, the first undersampled region, the second undersampled region, and/or the third undersampled region may at least partially overlap with one or two of the other undersampled regions. In some embodiments, the first undersampled region, the second undersampled region and/or the third undersampled region do not overlap with each other. Note that the first undersampled region, the second undersampled region and/or the third undersampled region may construct an entire region of the k-space data. Therefore, the obtained plurality of sets of k-space scan data corresponding to multiple single-contrast images may construct full k-space data.

In 620, the processor (e.g., the sharable data determination module 420) may generate one or more sharable data sets based on the plurality of sets of scan data. In some embodiments, the sharable data sets may include a coil sensitivity map, a common edge map, or the like, or a combination thereof. The processor (e.g., the coil sensitivity generation unit 502 of the sharable data determination module 420) may generate the coil sensitivity map based on the undersampled k-space scan data of each contrast (e.g., T1, T2, or FLAIR). In some embodiments, the processor may generate the full k-space data by combining the undersampled k-space scan data of each contrast. For example, the processor may obtain the first k-space scan data of T1 image corresponding to the first sampling pattern (e.g., FIG. 8A), and the second k-space scan data of T2 image corresponding to the second sampling pattern (e.g., FIG. 8B).

The processor may generate the full k-space data (e.g., the generated full k-space data as illustrated in FIG. 8C) by combining the first k-space scan data and the second k-space scan data. In some embodiments, the processor may generate a coil sensitivity map based on a low-frequency portion of full k-space data of one or more contrasts. The processor may obtain a low-frequency portion of the full k-space data by using a low-pass filter (LPF). Exemplary low-pass filters may include an ideal low-pass filter (ILPF), a Butterworth low-pass filter (BLPF), a Gaussian low-pass filter, or the like, or any combination thereof. In some embodiments, the user or the system 100 may set a filter cutoff frequency for the low-pass filter. For example, the filter cutoff frequency may be determined according to the frequency with the index having a low singular value near zero. The k-space scan data whose frequency exceeds the filter cutoff frequency may be filtered out by the low-pass filter, while the k-space scan data whose frequency is lower than the filter cutoff frequency may be retained for further processing to determine a coil sensitivity map. The processor may further obtain the low-frequency portion of the full k-space data (or referred to as low-frequency data for brevity). The processor may generate the coil sensitivity map by performing the inverse Fourier transform on the low-frequency portion of the full k-space data.

In some embodiments, the processor may generate a coil sensitivity map based on a combination of a low-frequency portion of k-space data of each contrast of one or more contrasts. The processor may obtain low-frequency portion of the k-space data of each contrast separately. For example, the processor may obtain a first low-frequency portion of the k-space by low pass filtering the first k-space scan data of T1 contrast, a second low-frequency portion of the k-space data by low pass filtering the second k-space scan data of T2 contrast. The processor may generate a combination of the first low-frequency portion of the k-space data and the second low-frequency portion of the k-space data by determining rSoS of the first low-frequency portion of the k-space data and the second low-frequency portion of the k-space data. The processor may generate the coil sensitivity map by performing the inverse Fourier transform on the rSoS.

Figure 9A:
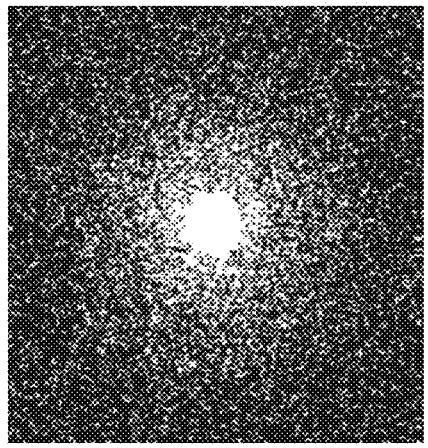
FIG. 9A is a schematic diagram illustrating a zero-padded k-space according to some embodiments of the present disclosure.
Figure 9B:
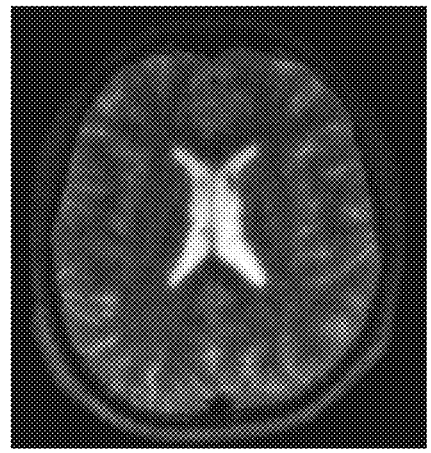
FIG. 9B is an exemplary MRI image obtained by performing inverse Fourier transform for the zero-padded k-space according to some embodiments of the present disclosure.

In some embodiments, the processor (e.g., the common edge generation unit 504 of the sharable data determination module 420) may generate the common edge map based on the undersampled k-space scan data of each contrast (e.g., T1, T2, or FLAIR). In some embodiments, the processor may fill an empty portion of the k-space with a constant, e.g., zero, so that the dimension of the k-space is equal to the dimension of the image to be reconstructed. For example, FIG. 9A is a schematic diagram illustrating a zero-padded k-space. As illustrated in FIG. 9A, k-space data in the white areas are actually sampled, while the k-space data in the black areas are obtained by zero-padding. The processor may generate an MRI image by performing inverse Fourier transform on the zero-padded k-space, for example, FIG. 9B. The processor may determine a raw horizontal edge map and a raw vertical edge map based on the MRI image. For example, the processor may determine the raw horizontal edge map (e.g., FIG. 9C) and/or the raw vertical edge map (e.g., FIG. 9D) according to a difference image based algorithm. Merely for illustration, the processor may determine the raw horizontal edge map and the raw vertical edge map based on Equation (3) and Equation (4), respectively, as follows:

$$f_x(x,y) = f(x+c,y) - f(x,y) \quad (3)$$

$$f_y(x,y) = f(x,y+c) - f(x,y) \quad (4)$$

where $f_x(x,y)$ denotes the raw horizontal edge map, $f_y(x,y)$ denotes the raw vertical edge map, $f(x,y)$ denotes the MRI image, $f(x+c, y)$ denotes the MRI image that shifts c pixels in horizontal (x-) direction (also referred to as the horizontal shifted MRI image), $f(x, y+c)$ denotes the MRI image that shifts c pixels in vertical (y-) direction (also referred to as the vertical shifted MRI image). c is an integer, such as 1, 2, 3, etc. Seen from Equations (3) and (4), the raw horizontal edge map may be a difference image between the MRI image and the horizontal shifted MRI image, and the raw vertical edge map may be a difference image between the MRI image and the vertical shifted MRI image.

In some embodiments, the processor may determine the raw horizontal edge map and the raw vertical edge map based on an edge detection operator (also called a gradient operator). Exemplary edge detection operators may include a Sobel operator, a Prewitt operator, etc. For example, the processor may detect the horizontal and vertical edges of an image by the horizontal edge detection template and the vertical edge detection template, respectively. In some embodiments, the horizontal edge detection template of a Sobel operator may be the matrix, $$\begin{bmatrix} -1 & 0 & 1 \\ -2 & 0 & 2 \\ -1 & 0 & 1 \end{bmatrix},$$

and the vertical edge detection template of the Sobel operator may be the matrix, $$\begin{bmatrix} 1 & 2 & 1 \\ 0 & 0 & 0 \\ -1 & -2 & -1 \end{bmatrix}.$$

In some embodiments, the horizontal edge detection template of a Prewitt operator may be the matrix, $$\begin{bmatrix} -1 & 0 & 1 \\ -1 & 0 & 1 \\ -1 & 0 & 1 \end{bmatrix},$$

and the vertical edge detection template of the Prewitt operator may be the matrix, $$\begin{bmatrix} 1 & 1 & 1 \\ 0 & 0 & 0 \\ -1 & -1 & -1 \end{bmatrix}.$$

Figures 9C, 9D:
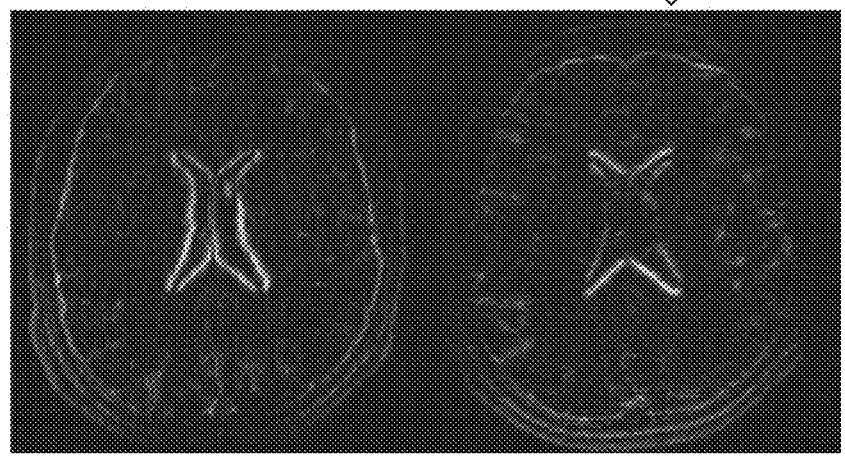
FIGS. 9C and 9D are an exemplary raw horizontal edge map and an exemplary raw vertical edge map, respectively, according to some embodiments of the present disclosure.

As shown in FIGS. 9C and 9D, the edges of the raw horizontal edge map and the raw vertical edge map may be blurry. The processor may further enhance the edges of the blurry edge maps based on a filtering algorithm to obtain enhanced edge maps. Exemplary filtering algorithms may include an inverse filtering algorithm, a rank-constrained filtering algorithm, a Wiener filtering algorithm, or the like, or any combination thereof. Merely for illustration, the processor may determine a raw horizontal edge map of T1 contrast (also referred to as T1 horizontal edge map) as illustrated in FIG. 10A and a raw vertical edge map of T1 contrast (also referred to as T1 vertical edge map) as illustrated in FIG. 10B based on the scan data corresponding to the T1 contrast by using a finite difference algorithm. The processor may determine an enhanced T1 horizontal edge map as illustrated in FIG. 10O and an enhanced T1 vertical edge map as illustrated in FIG. 10D by using a filtering algorithm (e.g., an inverse filtering algorithm). As another example, the processor may determine a raw horizontal edge map of T2 image (also referred to as T2 horizontal edge map) as illustrated in FIG. 10E and a raw vertical edge map of T2 image (also referred to as T2 vertical edge map) as illustrated in FIG. 10F based on the scan data corresponding to the T2 image by using a finite difference algorithm. The processor may determine an enhanced T2 horizontal edge map as illustrated in FIG. 10G and an enhanced T2 vertical edge map as illustrated in FIG. 10H by using a filtering algorithm (e.g., an inverse filtering algorithm).

In some embodiments, the processor may determine the common edge map by combining the enhanced edge maps of multiple contrasts. The common edge map may include a common horizontal edge map in a horizontal dimension and a common vertical edge map in a vertical dimension. For example, the processor may determine a common horizontal edge map as illustrated in FIG. 10J by combining the enhanced T1 horizontal edge map (i.e., FIG. 10O) and the enhanced T2 horizontal edge map (i.e., FIG. 10G). The processor may also determine a common vertical edge map as illustrated in FIG. 10K by combining the enhanced T1 vertical edge map (i.e., FIG. 10D) and the enhanced T2 vertical edge map (i.e., FIG. 10H). Merely by way of example, the processor may determine a first root of sum of squares (rSoS) of the enhanced T1 horizontal edge map and the enhanced T2 horizontal edge map, and further generate the common horizontal edge map based on the first rSoS. Similarly, the processor may determine a second rSoS of the enhanced T1 vertical edge map and the enhanced T2 vertical edge map, and further generate the common vertical edge map based on the second rSoS.

In some embodiments, the processor may obtain the k-space data in a center region of k-space across all contrasts (i.e., T1, T2, and FLAIR), for example, the k-space data in the center region of k-space as illustrated in FIG. 8C. The k-space data in the center region of k-space across all contrasts is denoted as $\hat{d}$. In some embodiments, the center region of k-space may be an autocalibration (AC) region. The AC region may refer to a certain number of phase lines in the center region of k-space, for example, three lines including line 1 to line −1 as illustrated in FIG. 8C. The user may specify the AC region before the scanning process. The processor may construct a structured matrix $\mathcal{T}(\hat{d})$ based on the k-space data $\hat{d}$. For example, the processor may construct the structured matrix by sliding a patch throughout the k-space data $\hat{d}$ (e.g., the k-space data of the AC region), and fill the data covered by the patch into a row of the structured matrix. In some embodiments, the constructed structured matrix is a Hankel matrix. Assuming the edges (or the edge sets) in the image to be reconstructed may be localized or limited to the zero set of a trigonometric polynomial, the Fourier coefficients of the partial derivatives of the image may satisfy a linear annihilating filter relation by Equation (5) as follows:

$$\mathcal{T}(\hat{d})W=0, \tag{5}$$

where W is the common edge map to all contrasts. The common edge map $W=[W_v,W_h]$ may include a common vertical edge map $W_v$ and a common horizontal edge map $W_h$, respectively. The processor may determine the common edge map by solving Equation (4). More specifically, the processor may perform a singular value decomposition (SVD) of the structure matrix $\mathcal{T}(\hat{d})$ in order to extract a plurality of null space vectors from $\mathcal{T}(\hat{d})$. The processor may further generate the common edge map by reshaping the plurality of null space vectors to the size of the image to be reconstructed.

In some embodiments, the processor may generate the common edge map by way of spectral decomposition of the image. When the low spatial frequencies form k-space are suppressed, little contrast appears in the image, yet edge definition remains. It is exploiting the fact that the fine details of the image such as edges are contained in the high spatial frequency portion that are in the peripheries of k-space. As disclosed in 620, the processor may generate an MRI image by performing inverse Fourier transform on the zero-padded k-space of a single contrast (also referred to as a single contrast image). The processor may determine an image gradient for the single contrast image based on the gradient operator. The processor may then perform an SVD on the image gradient of the single contrast image. The SVD of the image gradient may be expressed as Equation (6) as follows:

$$\partial(X_i)=U_i S_i V_i^*, \tag{6}$$

where $X_i$ denotes a single contrast image, $\partial(X_i)$ denotes an image gradient of a single contrast image, i is the index of the contrast, $U_i$ and $V_i$ are unitary matrixes, respectively, and $S_i$ is the singular value of the image gradient $\partial(X_i)$. The processor may determine a matrix Z by the sum of squares (SoS) of $\alpha_i U_i V_i^*$ from all of the contrasts, where $\alpha_i$ is a constant value. The processor may further perform SVD of the matrix Z according to Equation (7) as follows:

$$Z=\Sigma_i \sqrt{(\alpha_i U_i V_i)^2}=U'S'V'^*, \tag{7}$$

where U' and V'* are unitary matrixes, respectively, and S' is the singular value of Z. The processor may determine the common edge map by combining the SoS of singular values of each contrast ($S=\Sigma_i\sqrt{(\alpha_i S_i)^2}$), U' and V', that is U'SV'*. In order to prevent or reduce noise amplification of the high frequency portion (I.e, the edges) in the process of generating the common edge map, a singular value thresholding (SVT) process may be performed to suppress the noise amplification.

In 630, the processor (e.g., the optimized data determination module 430) may generate at least one optimized data set for each of a plurality of scanning characteristic. In some embodiments, the optimized data set may include an optimized edge map. In some embodiments, the optimized edge map may be a contrast-specific edge map for a contrast (e.g., T1, T2, or FLAIR). The processor may determine the contrast-specific edge map of a contrast based on the sharable data sets, such as the common edge map and the coil sensitivity map. Merely by way of example, the processor may generate a contrast-specific edge map based on Equations (8) and (9) as follows:

$$\underset{u_{v,i}}{\operatorname{argmin}}\|\partial_v d_i - Eu_{v,i}\|_2^2 + \lambda\|J(W_v)u_{v,i}\|_1, \quad (8)$$

$$\underset{u_{h,i}}{\operatorname{argmin}}\|\partial_h d_i - Eu_{h,i}\|_2^2 + \lambda\|J(W_h)u_{h,i}\|_1, \quad (9)$$

where i is the index of each contrast (e.g., i=1, 2, 3 for T1, T2, FLAIR, respectively), $\partial_v d_i$ and $\partial_h d_i$ denote the gradients of the common vertical edge map gradient and the common horizontal edge map, respectively, E denotes an encoding operator, $u_{v,i}$ denotes the contrast-specific edge map in the vertical dimension (also referred to as a vertical contrast-specific edge map), $u_{h,i}$ denotes the contrast-specific edge map in the horizontal dimension (also referred to as a horizontal contrast-specific edge map), $\lambda$ denotes a regularization parameter, $W_v$ denotes the common vertical edge map, $W_h$ denotes the common horizontal edge map, and J(W) is a functional relating to the common edge map and contains the weight coefficients that may control the shape of the contrast-specific edge map. J( ) is a functional that used to control a shape of an image. The processor may determine the terms and $u_{v,i}$ and $u_{h,i}$ of Equations (8) and (9) when the Equations (8) and (9) attain their own respective minimum values. In some embodiments, the processor may preset the regularization parameter $\lambda$ (e.g., 0.001, 0.004) according to an empirical value. The first terms of Equations (8) and (9) describes data consistency of horizontal and vertical gradients in k-space. The second terms of Equations (8) and (9) are 1-norm of weighted gradient values.

In 640, the processor (e.g., the image reconstruction module 440) may reconstruct the plurality of sets of scan data to obtain reconstructed images for the at least one scanning characteristics. Merely by way of example, the processor may iteratively reconstruct each of the multiple single-contrast images by exploiting the corresponding contrast-specific edge map. For example, the processor may iteratively reconstruct the each of the multiple single-contrast images based on Equation (10) as follows:

$$\underset{f_i}{\operatorname{argmin}}\sum_i^N \|d_i - Ef_i\|_2^2 + \lambda_1\|u_i^{-1}\nabla f_i\|_1 + \lambda_2\|\Psi(f_i)\|_1, \quad (10)$$

where i is the index of each image contrast ($1\leq i\leq N$ for N imaging sequences, the imaging parameters of one of the imaging sequence may differ from those of another one, e.g., i=1, 2, 3 for T1, T2, FLAIR, respectively), $f_i$ denotes the MRI image to be reconstructed (e.g., a T1 image, a T2 image, or an FLAIR image), $d_i$ denotes the k-space scan data corresponding to the MR signals of image contrast i, $\lambda_1$ and $\lambda_2$ denote a first regularization parameter and a second regularization parameter, respectively, which may balance the weight between the data consistency and regularization, $u=[u_{v,i},u_{h,i}]$ denotes the vertical and horizontal contrast-specific edge maps, $\nabla f_i=[\partial_v f_i, \kappa_h f_i]$ denotes an MRI image gradient, wherein denotes a gradient of the MRI image in the vertical dimension, $\partial_v f_i$ denotes a gradient of the MRI image in the horizontal dimension, $\Psi(x)$ denotes a sparsifying transform for promoting sparsity of the data, such as the Wavelet transform. $\|\cdot\|_2$ denotes the Euclidian norm, and $\|\ \|_1$ denotes the 1-norm. In some embodiments, the user may preset the first regularization parameter and the second regularization parameter according to empirical values. Equation (10) includes three terms, that is $\|d_i-Ef_i\|_2^2$ denotes the data fidelity term which assesses the consistency between the reconstructed image and the measurements (e.g., the obtained plurality of sets of k-space scan data), $\lambda_1\|u_i^{-1}\nabla f_i\|_1$ denotes the contrast-specific edge map weighted Total Variation (TV), and $\lambda_2\|\Psi(f_i)\|_1$ denotes 1-norm with sparsifying transform for robust reconstruction quality. The processor may reconstruct each of the multiple single-contrast images (e.g., T1 image, T2 image, or FLAIR image) by solving the minimum value of the Equation (10).

In some embodiments, the processor may determine the image gradients based on a gradient operator. Exemplary gradient operators may include a Robert operator, a Prewitt operator, a Sobel operator, an Isotropic Sobel operator, a Laplace operator, or the like, or any combination thereof.

FIGS. 11A to 11L illustrates exemplary reconstructed images according to some embodiments of the present disclosure. For instance, as shown in FIGS. 11A to 11F, two images in FIG. 11A and FIG. 11D are included in a dash box 1100. FIG. 11A is a reconstructed T2 image using a first reconstruction algorithm, SpareSENSE, and FIG. 11D is an enlarged view of the rectangular frame in FIG. 11A. Two images FIG. 11B and FIG. 11E are included in a dash box 1120. FIG. 11B is a reconstructed T2 image using a second reconstruction algorithm, multi-contrast Fast Composite Splitting Algorithm (FCSA-MT), and FIG. 11E is an enlarged view of the rectangular frame in FIG. 11B. Two images FIG. 11C and FIG. 11F are included in a dash box 1130. FIG. 11C is a reconstructed FLAIR image using the reconstruction algorithm as described in the process 600, and FIG. 11F is an enlarged view of the rectangular frame in FIG. 11C. A comparison among the reconstruction results using the first reconstruction method, the second reconstruction method, and the reconstruction algorithm as described in the process 600 such as FIG. 11D, FIG. 11E, and FIG. 11F), indicates that the reconstruction result using the reconstruction algorithm as described in the process 600 has a better image quality. For example, FIG. 11F contains less noise comparing to FIG. 11D and FIG. 11E. In another example, as shown in FIGS. 11G to 11L, two images FIG. 11G and FIG. 11J are included in a dash box 1140. FIG. 11G is a reconstructed FLAIR image using the first reconstruction algorithm, SpareSENSE, and FIG. 11J is an enlarged view of the rectangular frame in FIG. 11G. Two images FIG. 11H and FIG. 11K are included in a dash box 1150. FIG. 11H is a reconstructed FLAIR image using the second reconstruction algorithm, FCSA-MT, and FIG. 11K is an enlarged view of the rectangular frame in FIG. 11H. Two images FIG. 11I and FIG. 11L are included in a dash box 1160 FIG. 11I is a reconstructed FLAIR image using the reconstruction algorithm as described in process 600, and FIG. 11L is an enlarged view of the rectangular frame in FIG. 11I. A comparison among the reconstruction results using the first reconstruction algorithm, the second reconstruction algorithm, and the reconstruction algorithm described in process 600 (such as FIG. 11J, FIG. 11K, and FIG. 1), indicates that the reconstruction result using the reconstruction algorithm described in process 600 has a better image quality. For example, FIG. 11L contains less noise comparing to FIG. 11J and FIG. 11K. The reconstruction algorithm as described in the present disclosure may have a better reconstruction quality for multi-contrast images.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A non-transitory computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/ or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

We claim:

1. A method for image reconstruction implemented on at least one machine each of which has at least one processor and at least one storage device, the method comprising:
    obtaining a plurality of sets of scan data captured by a magnetic resonance imaging (MRI) device, each set of scan data corresponding to a same scanning area of an object, wherein the plurality of sets of scan data are a plurality of sets of undersampled k-space scan data, each set of scan data corresponds to one of a plurality of scanning characteristics, and the plurality of scanning characteristics include a plurality of scanning contrasts;
    generating one or more shareable data sets based on the plurality of sets of scan data;
    generating, based on the one or more shareable data sets, at least one optimized data set for each of the plurality of scanning characteristics; and
    reconstructing, based on at least one optimized data set for at least one of the plurality of scanning characteristics, the plurality of sets of scan data to obtain a reconstructed image for the at least one scanning characteristic, wherein
    the shareable data set includes a common edge map, and
    the generating one or more shareable data sets based on the plurality of sets of scan data includes:
    for each of the plurality of scanning contrasts:
        obtaining zero-padded k-space data by filling an empty portion of the undersampled k-space scan data corresponding to the scanning contrast;
        generating an MRI image corresponding to the scanning contrast by performing inverse Fourier transform on the zero-padded k-space scan data;
        determining a raw horizontal edge map and a raw vertical edge map based on the MRI image corresponding to the scanning contrast; and
        generating the raw edge map based on the raw horizontal edge map and the raw vertical edge map; and
    generating a common edge map by combining the plurality of raw edge maps.

2. The method of claim 1, wherein the plurality of scanning contrasts include at least one of T1, T2, or fluid attenuated inversion recovery (FLAIR).

3. The method of claim 1, wherein the generating one or more shareable data sets based on the plurality of sets of scan data further includes:
    generating a coil sensitivity map based on the plurality of sets of k-space scan data.

4. The method of claim 1, wherein the determining the raw horizontal edge map and the raw vertical edge map based on the MRI image corresponding to the scanning contrast includes:
    shifting the MRI image horizontally by one or more pixels to obtain a horizontally shifted MRI image;
    determining a difference image between the MRI image and the horizontally shifted MRI image as the raw horizontal edge map;
    shifting the MRI image vertically by one or more pixels to obtain a vertically shifted MRI image; and
    determining a difference image between the MRI image and the vertically shifted MRI image as the raw vertical edge map.

5. The method of claim 4, wherein the generating the common edge map by combining the plurality of raw edges maps includes:
    determining a first root of sum of squares of the raw horizontal edge maps of the plurality of scanning contrasts;
    generating a common horizontal edge map based on the first root of sum of squares;
    determining a second root of sum of squares of the raw vertical edge maps of the plurality of scanning contrasts;
    generating a common vertical edge map based on the second root of sum of squares; and
    generating the common edge map based on the common horizontal edge map and the common vertical edge map.

6. The method of claim 3, wherein the generating a coil sensitivity map based on the plurality of sets of k-space scan data includes:
    generating the coil sensitivity map based on a low-frequency portion of the plurality of sets of k-space scan data.

7. The method of claim 6, wherein the generating the coil sensitivity map based on a low-frequency portion of the plurality of sets of k-space scan data includes:
    combining the plurality of sets of k-space scan data to obtain a full k-space data;
    obtaining a low-frequency portion of the full k-space data using a low-pass filter; and
    generating the coil sensitivity map based on the low-frequency portion of the full k-space data.

8. The method of claim 6, wherein the generating the coil sensitivity map based on a low-frequency portion of the plurality of sets of k-space scan data includes:
    for each of the plurality of scanning contrasts:
        obtaining a low-frequency portion of k-space scan data corresponding to the scanning contrast by filtering the k-space scan data of the scanning contrast;

determining a root of sum of squares of the plurality of low-frequency portions of k-space scan data of the plurality of scanning contrasts; and
generating the coil sensitivity map based on the root of sum of squares of the plurality of low-frequency portions of k-space scan data of the plurality of scanning contrasts.

9. The method of claim 3, wherein the generating, based on the one or more shareable data sets, at least one optimized data set for each of the plurality of scanning characteristics includes:
generating, based on the common edge map and the coil sensitivity map, a contrast-specific edge map for each of the plurality of scanning contrast.

10. The method of claim 3, wherein the generating a common edge map based on the plurality of sets of k-space scan data includes:
obtaining a set of center k-space data corresponding to a center region of a k-space across all of the plurality of scanning contrasts;
constructing a structured matrix based on the set of center k-space data by sliding a patch throughout the set of center k-space data and involving k-space data included in the patch in a row of the structured matrix;
extracting a plurality of null space vectors from the structured matrix by performing a singular value decomposition (SVD) of the structured matrix; and
generating the common edge map by reshaping the plurality of null space vectors.

11. The method of claim 3, wherein the generating a common edge map based on the plurality of sets of k-space scan data includes:
for each scanning contrast:
obtaining zero-padded k-space data by filling an empty portion of the k-space scan data corresponding to the scanning contrast;
generating an MRI image corresponding to the scanning contrast by performing inverse Fourier transform on the zero-padded k-space scan data;
determining an image gradient of the MRI image based on a gradient operator;
performing a first singular value decomposition (SVD) on the image gradient to obtain two first unitary matrixes and a singular value of the image gradient;
determining a first matrix based on the two first unitary matrixes of each scanning contrast;
performing a second SVD on the first matrix to obtain two second unitary matrixes; and
generating the common edge map based on the two second unitary matrixes and a sum of squares of the singular values of the image gradient corresponding to each scanning contrast.

12. A system for image reconstruction, comprising:
a storage device including a set of instructions; and
at least one processor in communication with the storage device, wherein when executing the set of instructions, the at least one processor is directed to cause the system to:
obtain a plurality of sets of scan data captured by a magnetic resonance imaging (MRI) device, each set of scan data corresponding to a same scanning area of an object, wherein the plurality of sets of scan data are a plurality of sets of undersampled k-space scan data, each set of scan data corresponds to one of a plurality of scanning characteristics, and the plurality of scanning characteristics include a plurality of scanning contrasts;
generate one or more shareable data sets based on the plurality of sets of scan data;
generate, based on the one or more shareable data sets, at least one optimized data set for each of the plurality of scanning characteristics; and
reconstruct, based on at least one optimized data set for at least one of the plurality of scanning characteristics, the plurality of sets of scan data to obtain a reconstructed image for the at least one scanning characteristic, wherein
the shareable data set includes a common edge map, and
the generate one or more shareable data sets based on the plurality of sets of scan data includes:
for each of the plurality of scanning contrasts:
obtain zero-padded k-space data by filling an empty portion of the undersampled k-space scan data corresponding to the scanning contrast;
generate an MRI image corresponding to the scanning contrast by performing inverse Fourier transform on the zero-padded k-space scan data;
determine a raw horizontal edge map and a raw vertical edge map based on the MRI image corresponding to the scanning contrast; and
generate the raw edge map based on the raw horizontal edge map and the raw vertical edge map; and
generate a common edge map by combining the plurality of raw edge maps.

13. The system of claim 12, wherein the plurality of scanning characteristics include a plurality of scanning contrasts, and wherein the plurality of scanning contrasts include at least one of T1, T2, or fluid attenuated inversion recovery (FLAIR).

14. A non-transitory computer-readable medium, comprising at least one set of instructions, wherein when executed by at least one processor of a computer device, the at least one set of instructions directs the at least one processor to:
obtain a plurality of sets of scan data captured by a magnetic resonance imaging (MRI) device, each set of scan data corresponding to a same scanning area of an object, wherein the plurality of sets of scan data are a plurality of sets of undersampled k-space scan data, and each set of scan data correspond to one of a plurality of scanning contrasts;
generate one or more shareable data sets based on the plurality of sets of scan data;
generate, based on the one or more shareable data sets, at least one optimized data set for each of the plurality of scanning characteristics; and
reconstruct, based on at least one optimized data set for at least one of the plurality of scanning characteristics, the plurality of sets of scan data to obtain a reconstructed image for the at least one scanning characteristic, wherein
the shareable data set includes a common edge map, and
the generate one or more shareable data sets based on the plurality of sets of scan data includes:
for each of the plurality of scanning contrasts:
obtain zero-padded k-space data by filling an empty portion of the undersampled k-space scan data corresponding to the scanning contrast;
generate an MRI image corresponding to the scanning contrast by performing inverse Fourier transform on the zero-padded k-space scan data;
determine a raw horizontal edge map and a raw vertical edge map based on the MRI image corresponding to the scanning contrast; and generate the raw edge map based on the raw horizontal edge map and the raw vertical edge map; and generate a common edge map by combining the plurality of raw edge maps.

15. The method of claim 1, wherein each set of the undersampled k-space scan data corresponds to a region of a k-space, and the regions relating to the plurality of sets of the undersampled k-space scan data construct an entire region of the k-space.

16. The method of claim 15, wherein a first region corresponding to a first set of the undersampled k-space scan data at least partially overlaps with a second region corresponding to a second set of the undersampled k-space scan data.

17. The method of claim 15, wherein the regions corresponding to the plurality of sets of the undersampled k-space scan data do not overlap with each other.

* * * * *